US012656689B2

(12) United States Patent
Petek et al.

(10) Patent No.: US 12,656,689 B2
(45) Date of Patent: Jun. 16, 2026

(54) SYSTEMS AND METHODS FOR FORMING TOPOLOGICAL LATTICES OF PLASMONIC MERONS

(71) Applicant: University of Pittsburgh—Of the Commonwealth System of Higher Education, Pittsburgh, PA (US)

(72) Inventors: Hrvoje Petek, Pittsburgh, PA (US); Zhikang Zhou, Pittsburgh, PA (US); Atreyie Ghosh, Pittsburgh, PA (US); Sena Yang, Pittsburgh, PA (US); Tianyi Wang, Pittsburgh, PA (US); Chen-Bin Huang, Hsinchu City (TW); Yanan Dai, New York, NY (US)

(73) Assignees: University of Pittsburgh—Of the Commonwealth System of Higher Education, Pittsburgh, PA (US); The Trustees of Columbia University In the City of New York, New York, NY (US)

( * ) Notice: Subject to any disclaimer, the term of this patent is extended or adjusted under 35 U.S.C. 154(b) by 115 days.

(21) Appl. No.: 18/684,894

(22) PCT Filed: Aug. 19, 2022

(86) PCT No.: PCT/US2022/040875
§ 371 (c)(1),
(2) Date: Feb. 20, 2024

(87) PCT Pub. No.: WO2023/023317
PCT Pub. Date: Feb. 23, 2023

(65) Prior Publication Data
US 2024/0353758 A1 Oct. 24, 2024

Related U.S. Application Data

(60) Provisional application No. 63/235,343, filed on Aug. 20, 2021.

(51) Int. Cl.
*G03F 7/00* (2006.01)

(52) U.S. Cl.
CPC ...... *G03F 7/70091* (2013.01); *G03F 7/70041* (2013.01); *G03F 7/7015* (2013.01); *G03F 7/70325* (2013.01); *G03F 7/70375* (2013.01)

(58) Field of Classification Search
CPC ......... B82Y 10/00; B82Y 40/00; B82Y 20/00; B82Y 25/00; B82Y 35/00; H01L 21/0274;
(Continued)

(56) References Cited

U.S. PATENT DOCUMENTS

2003/0129545 A1* 7/2003 Kik ..................... G03F 7/70408
430/311
2009/0214885 A1 8/2009 Her et al.
(Continued)

FOREIGN PATENT DOCUMENTS

CN 109848565 A 6/2019

OTHER PUBLICATIONS

Dai, Y., Zhou, Z., Ghosh, A. et al. "Plasmonic topological quasiparticle on the nanometre and femtosecond scales." Nature 588, 616-619 (2020). https://doi.org/10.1038/s41586-020-3030-1 (Year: 2020).*
(Continued)

*Primary Examiner* — Christina A Riddle
(74) *Attorney, Agent, or Firm* — Goodwin Procter LLP

(57) ABSTRACT

Methods and systems for assembling electron spin and charge to possess one or more properties of a topological plasmonic spin texture array for performing lithography that is not limited by an optical system's diffraction limit are disclosed. According to one embodiment, the method includes defining a polarization of an optical field of light and a corresponding coupling-structure geometry. The method includes providing a coupling structure having the defined coupling-structure geometry in a metallic material,
(Continued)

τ    τ+0.2 fs    τ+0.4 fs    τ+0.6 fs the coupling structure defining a region of the metallic material. The method includes directing light having the defined polarization to a center of the region, forming a lattice of plasmonic merons having a finer contrast resolution than a diffraction or reflection based resolution determined by Abbe limit based on the defined polarization of the optical field.

24 Claims, 23 Drawing Sheets

(58) Field of Classification Search
CPC ............. H01L 21/67739; H01L 21/027; H01L 21/0332; H01L 21/67; H01L 21/67259; H01L 21/67745; H01L 21/683; G02B 26/06; G02B 26/0833; G02B 27/0905; G02B 27/0961; G02B 27/28; G02B 5/30; G03F 7/70325; G03F 7/7035; G03F 7/70375; G03F 7/70383; G03F 7/704; G03F 7/70391; G03F 7/70408; G03F 7/70416; G03F 7/70566; G03F 7/7055; G03F 7/70041; G03F 7/70025; G03F 7/70091; G03F 7/7015; G03F 7/70958; G03F 7/70033; H10N 50/85; H10N 50/10; H10N 60/83; H10N 60/85; H10N 50/01; H10N 52/00; H10N 50/20; H10N 50/80; G06N 10/40; G06N 10/20; H01F 10/3286; H01F 41/14; H01F 10/32; H01F 10/123; H01F 41/32
USPC .............. 355/18, 27, 30, 52–55, 66–77, 133
See application file for complete search history.

(56) References Cited

U.S. PATENT DOCUMENTS

| | | | |
|---|---|---|---|
| 2019/0006343 A1 | 1/2019 | Chen et al. | |
| 2019/0377213 A1* | 12/2019 | Wei | G03F 1/50 |
| 2020/0371026 A1* | 11/2020 | Dutta | G01N 21/553 |
| 2024/0371540 A1* | 11/2024 | Petek | G06N 10/40 |

OTHER PUBLICATIONS

Bliokh et al. (2015) "Spin-orbit interactions of light," Nature Photonics 9(12):796-808.
Bliokh et al. (2017) "Theory and applications of free-electron vortex states," Physics Reports 690:1-70.
Dai et al. "The birth of a plasmonic topological quasiparticle on the nanofemto scale," arXiv preprint arXiv:1912.03831 (2019).
Ghosh et al. "A topological lattice of plasmonic merons," Applied Physics Reviews 8.4:041413 (2021).
Grillo et al. (2017) "Observation of nanoscale magnetic fields using twisted electron beams," Nature Communications 8(1):1-6.
International Search Report and Written Opinion for PCT/US2022/025894 mailed Aug. 16, 2022 (9 pages).
International Search Report and Written Opinion for PCT/US2022/040875 mailed Dec. 20, 2022 (14 pages).
Padgett et al. (2004) "Light's orbital angular momentum," Physics Today 57(5):35-40.
Skvortsov et al. (2002) "The Magnetic Monopoles generation in laserinduced discharges," 29 EPS Conference on Plasma Phys. 26B (4 pages).
Vanacore et al. (2019) "Ultrafast Generation and Control of an Electron Vortex Beam via Chiral Plasmonic Near Fields," Nature Materials 18(6):573-9.
Xiao et al. (2017) "Spin-dependent optics with metasurfaces," Nanophotonics 6(1):215-124.

\* cited by examiner

116

118

106

108

Figure 2:
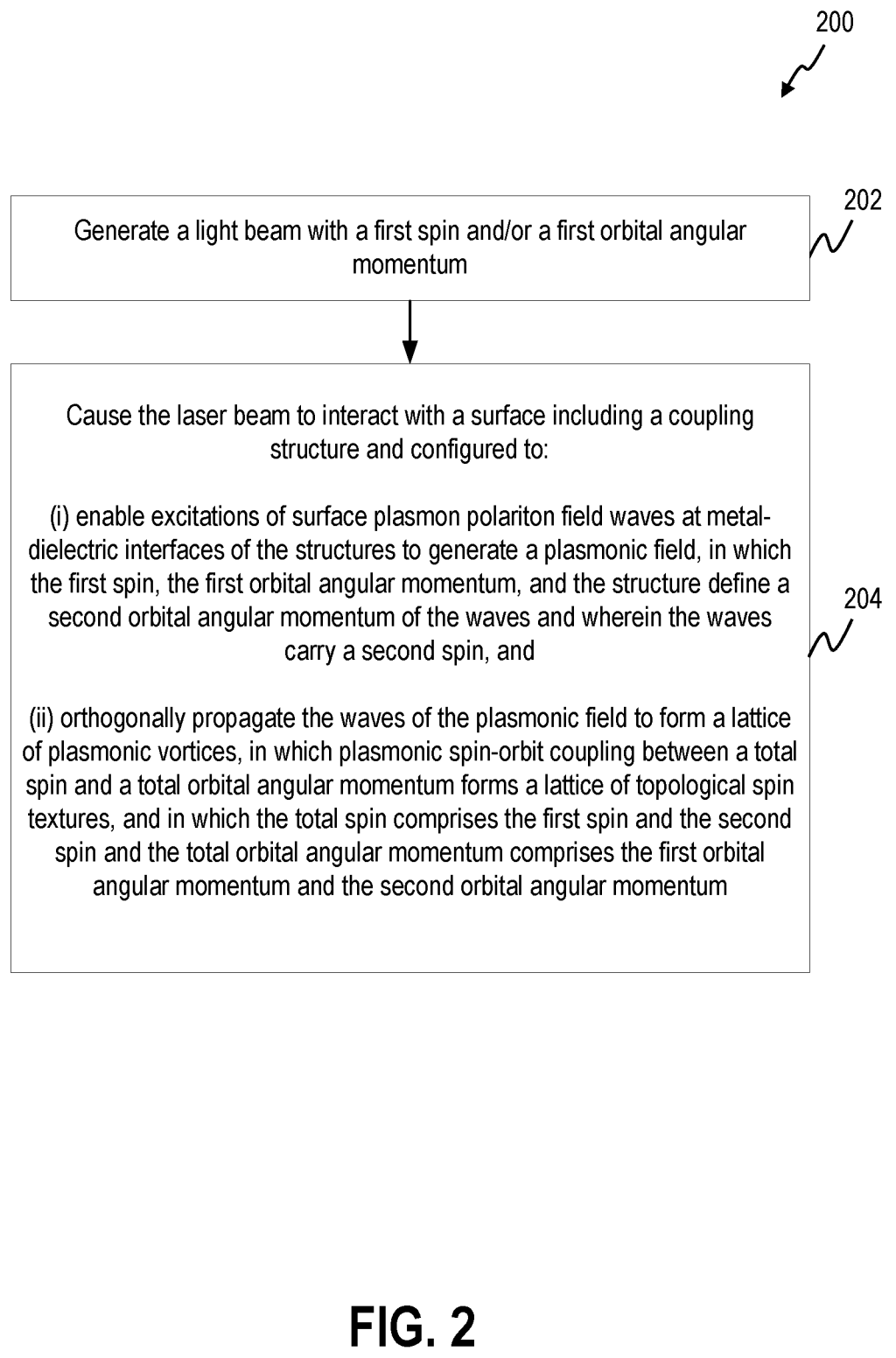

200

202

Generate a light beam with a first spin and/or a first orbital angular momentum

204

Cause the laser beam to interact with a surface including a coupling structure and configured to:

(i) enable excitations of surface plasmon polariton field waves at metal-dielectric interfaces of the structures to generate a plasmonic field, in which the first spin, the first orbital angular momentum, and the structure define a second orbital angular momentum of the waves and wherein the waves carry a second spin, and (ii) orthogonally propagate the waves of the plasmonic field to form a lattice of plasmonic vortices, in which plasmonic spin-orbit coupling between a total spin and a total orbital angular momentum forms a lattice of topological spin textures, and in which the total spin comprises the first spin and the second spin and the total orbital angular momentum comprises the first orbital angular momentum and the second orbital angular momentum

Collect a spatial distribution of the assembled electron spin and charge

404

Image the collected assembled electron spin and charge

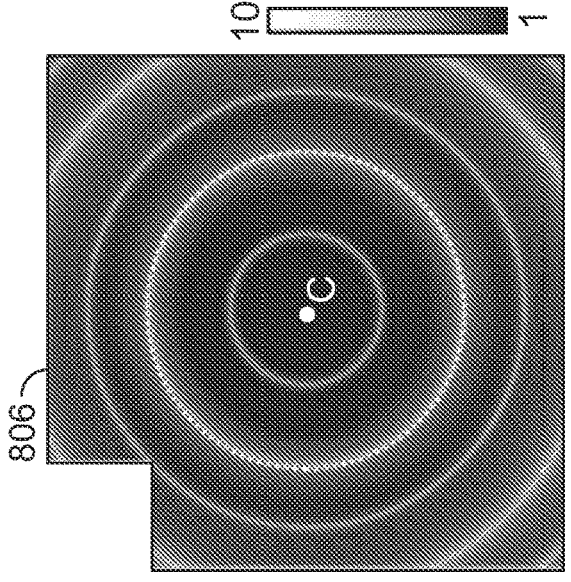
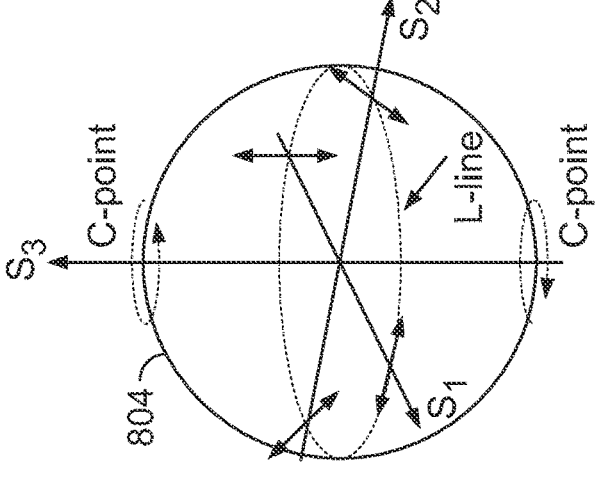
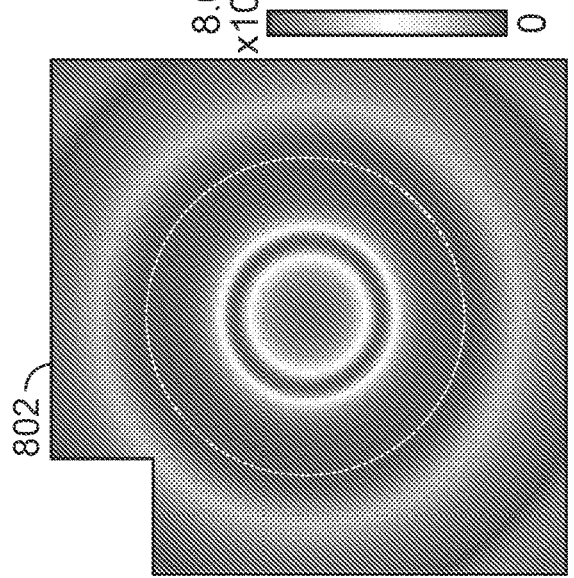
FIG. 8

FIG. 14

SYSTEMS AND METHODS FOR FORMING TOPOLOGICAL LATTICES OF PLASMONIC MERONS

CROSS-REFERENCE TO RELATED APPLICATIONS

This application is a U.S. national stage entry, filed under 35 U.S.C. § 371, of International Patent Application No. PCT/US2022/040875, filed on Aug. 19, 2022, which claims priority to and the benefit of U.S. Provisional Patent Application No. 63/235,343, entitled "SYSTEMS AND METHODS FOR FORMING TOPOLOGICAL LATTICES OF PLASMONIC MERONS," filed on Aug. 20, 2021, the entire contents of each of which are incorporated herein by reference.

STATEMENT REGARDING FEDERALLY SPONSORED RESEARCH OR DEVELOPMENT

This invention was made with government support under N00014-20-S-F003 awarded by the Defense Advanced Research Projects Agency. The government has certain rights in the invention.

TECHNICAL FIELD

The following disclosure is directed to methods and systems for generating a plasmonic spin texture array and, more specifically, methods and systems for assembling electron spin and charge to possess one or more properties of a topological plasmonic spin texture array.

BACKGROUND

Topological properties can serve in defining roles in physical systems, ranging from high energy physics, where they may be generally inaccessible, to solid state physics, where they can serve as a bridge between microscopic, atomic, and even subatomic scales. A meron is a characteristic topological quasiparticle that has been identified in magnetic materials. In ferromagnetic solids, merons have stable vortex-like topological spin textures on a nanometer scale. Accordingly, merons (or meron-like structures) may provide the potential to manipulate spin currents in materials, enabling them to function as sensing and/or non-volatile memory devices. Further, contrasting spin textures resulting from plasmonic meron-like structures may produce nanometer scale singularities, which may be practical for use in lithographic applications.

SUMMARY

Electron spin and charge may be assembled to possess the properties of plasmonic meron-like structures. In one aspect, the disclosure features a method for performing lithography not limited by an optical system's diffraction limit. The method can include defining: (i) a polarization of an optical field of light, and (ii) a corresponding coupling-structure geometry; providing a coupling structure having the defined coupling-structure geometry in a metallic material, the coupling structure defining a region of the metallic material; and directing light having the defined polarization to a center of the region, forming a lattice of plasmonic merons having a finer contrast resolution than a diffraction or reflection based resolution determined by Abbe limit based on the defined polarization of the optical field.

Various embodiments of the method can include one or more of the following features. The finer contrast resolution can be recorded by a polarization sensitive resist material in a near-field of a plasmonic field corresponding to the region. Defining the polarization can comprise selecting between left circular polarization (LCP) and right circular polarization (RCP) light. The metallic material can comprise a chiral photoresist that responds differently to the LCP and the RCP. Surface plasmon polaritons (SPPs) can form within the region in response to the light. Interference caused by the light illuminating a coupling structure for launching of SPP fields can form the lattice of plasmonic merons. The geometry of the coupling structure can comprise shape of the defined region, wherein the shape is square or hexagon. A dimension of the coupling structure can be a multiple of wavelength $\lambda_{SPP}$ of the SPPs. Providing the coupling structure can comprise providing a slit having the selected geometry within the metallic material. The light can be directed normal to surface of the metallic material, as pulses having a duration in the range 5-50 femtoseconds (fs), or longer. The light can be directed normal to surface of the metallic material, as continuous for a duration of time. The defined polarization can comprise left circular polarization (LCP) or right circular polarization (RCP). The defined polarization of the light and the defined coupling-structure geometry can define polarization singularities that define boundaries of cells of the lattice of plasmonic merons. The metallic material can comprise a surface plasmon supporting metallic material. The method can include lithographically forming a pattern in the metallic material according to the lattice.

BRIEF DESCRIPTION OF THE DRAWINGS

FIG. 2 is a flowchart of an example method for assembling electron spin and charge to possess one or more properties of a plasmonic spin texture array.

FIG. 8 is a diagram of characteristics of a plasmonic skyrmion.

FIG. 14 is a diagram of a lattice of meron-like SAM textures.

DETAILED DESCRIPTION

Figure 1A:
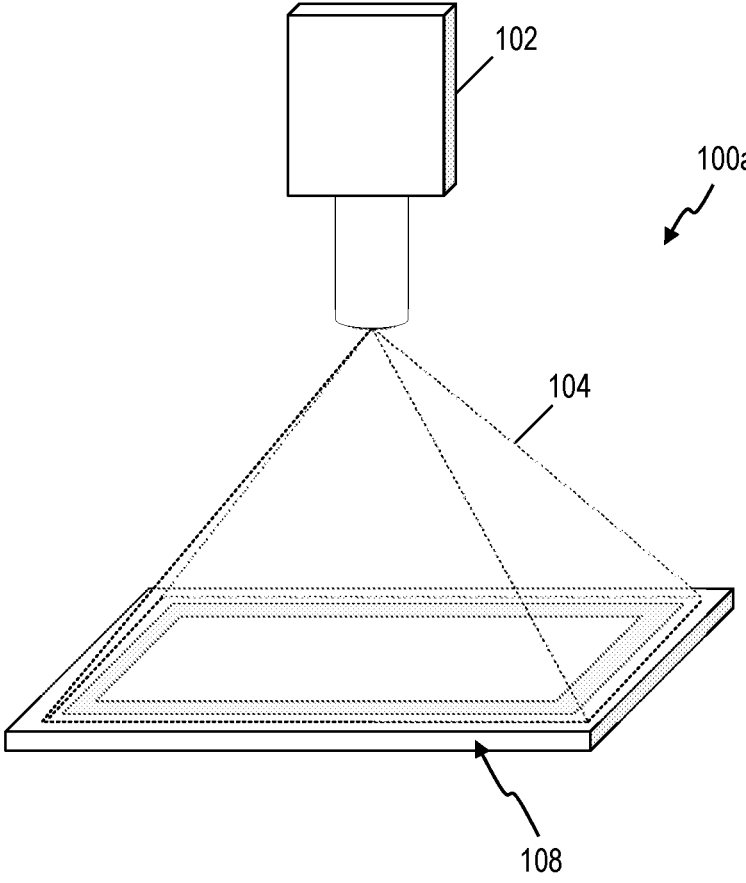
FIGS. 1A-1B are diagrams of example systems for assembling electron spin and charge to possess one or more properties of a plasmonic spin texture array.

In conventional applications, focusing of light by diffractive or reflective optics is restricted by the Abbe limit. The Abbe limit is defined by $\lambda/2NA$, where $\lambda$ is the wavelength of light and NA is the numerical aperture of the focusing optical device. In practical applications, NA has a value of approximately 1. Increasing NA beyond this value is extremely costly and can introduce defects into an optical system. In lithographic systems for semiconductor manufacturing, 5 nm structures may be achieved using diffractive or reflective optics for extreme ultraviolet (EUV) light sources operating at approximately 13.5 nm. But, achieving such resolution requires extreme precision optics manufacturing that can be cost prohibitive. However, the Abbe limit is not the fundamental limitation on which light can interact with matter for lithographic applications. Photons carry electric and magnetic fields, energy, and quantum mechanical spin. Electromagnetic fields can oscillate in time as they propagate at the speed of light in vacuum. Accordingly, only the intensity profile of light is limited by diffraction. Vectorial properties of light may be used to generate spin contrast in optical fields, which may be applied for lithographic purposes to achieve nanometer or sub-nanometer resolution with optically manipulated visible light. Because the spin of light can be manipulated at an arbitrarily small scale and is not constrained by diffraction or its other properties, spin contrast within electromagnetic fields can be obtained. Spin contrast within electromagnetic fields may be achieved through configuration of spin and orbital angular momentum (OAM) of light using diffractive optics, which can be produced using lithographically defined metamaterial surfaces.

Disclosed herein are exemplary embodiments of systems and methods for assembling electron spin and charge to possess one or more properties of a lattice of topological plasmonic spin textures. The example methods and systems include an optical laser beam with spin and/or orbital angular momentum (OAM) configured to interact with a surface. The surface can be configured to support surface plasmon polariton (SPP) excitations at metal/dielectric (e.g., vacuum) interfaces. The surface can include nano-lithographically formed structures (e.g., polygonal structures) that enable the excitations of surface plasmon polariton waves carrying orbital angular momentum, thereby focusing the plasmonic field to form a plasmonic vortex. The topological charge of the plasmonic field can be based on the spin and orbital angular momentum of the light beam and the geometrical charge of the plasmon coupling structure. The topological charge in turn defines the spin texture of the plasmonic field where it comes to a focus (e.g., in a vortex). The structure of the surface can define the resulting lattice structure of the plasmonic spin textures based on the generation and propagation of SPP fields.

In some embodiments, the spin texture of the plasmonic field has an integer topological charge corresponding to skyrmion-like spin textures. A skyrmion or skyrmion-like spin texture may have a topological charge defined as:

$$|m|=1,$$

where $|m|$ is the topological charge of the skyrmion.

In some embodiments, the spin texture of the plasmonic field has a half-integer topological charge corresponding to meron-like spin textures. A meron or meron-like spin texture may be referred to as a "half skyrmion". In some cases, two merons with an opposite topological charge may be combined to form a skyrmion. A skyrmion or skyrmion-like spin texture may have a topological charge defined as:

$$|n|=1/2,$$

where $|n|$ is the topological charge of the meron. Skyrmions may include similar properties to merons as described herein.

The spin textures can resemble plasmonic lattices, which can form through the spin-orbit interaction and interference of SPP fields. The plasmonic lattices can be configured based on geometric patterning of the generation and propagation of SPP fields. Phase discontinuities (e.g., circular (C-point) and linear (L-Line) polarizations) may separate different spin textures within the plasmonic lattice structure. Such phase discontinuities may be captured for lithographic purposes through use of chiral photoresist materials that respond to circularly polarized light (CPL) (e.g., left circularly polarized (LCP) light and/or right circularly polarized (RCP) light) optical signals.

The magnetic monopole elements comprised in the plasmonic lattice structures can break the time-reversal symmetry on the time scale of the plasmonic field. The magnetic monopole elements can be a source of photoemitted electrons by coherent nonlinear two-photon optical transmission that carry the spin of electrons and the orbital angular momentum of the plasmonic field. The orbital angular momentum of propagating electrons defines a Laguerre-Gaussian free electron beam with Bessel function distribution that is non-diffracting and self-healing. The nano-lithographically formed structure in the metal film can be configured such that it enables the generation of a single plasmonic vortex, plasmonic vortex clusters, and/or vortex arrays. The nano-lithographically formed structure in the metal film can be configured to define the geometry of a lattice of plasmonic vortices that result in a lattice of topological plasmonic spin textures. The plasmonic field and spin textures define the coherent electronic interactions in the solid state, in the near-field of the metal/dielectric interface, and/or freely propagating electron beams that are generated by nonlinear photoemission.

The following description provides example systems and methods for assembling electron spin and charge as a plasmonic lattice and detection systems and methods for same. Further, the description provides applications for the plasmonic lattice.

Systems and Methods for Assembling Electron Spin and Charge

Figure 1B:
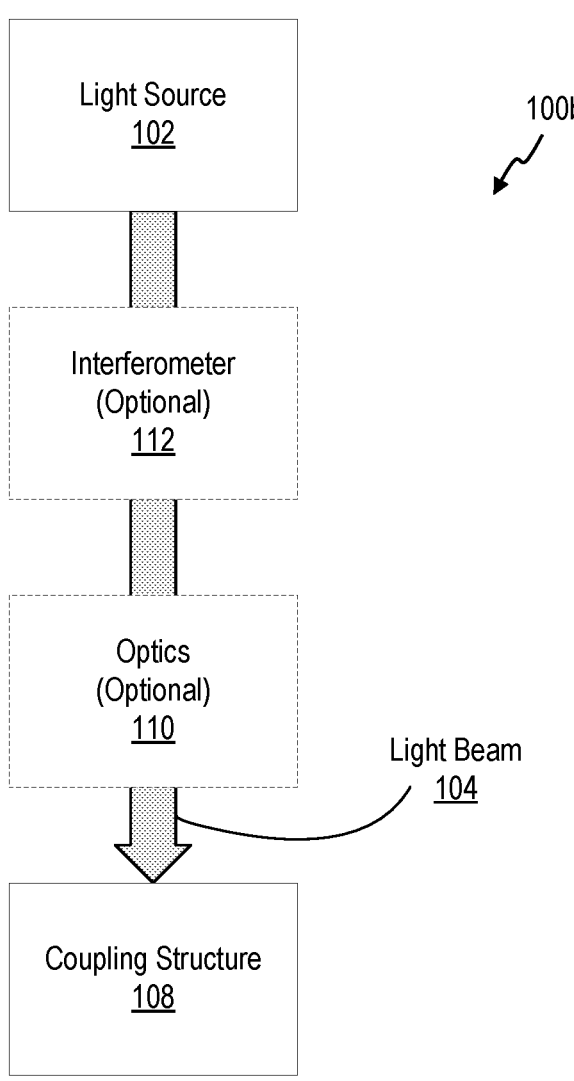

FIGS. 1A-1B illustrate example systems 100*a*, 100*b* (collectively referred to as system 100) for assembling electron spin and charge to possess one or more properties of a lattice of topological plasmonic spin textures. FIGS.

1C-1D illustrate the polarization (i.e. spin) and orbital angular momentum, respectively, of the light beam of FIGS. 1A-1B. FIG. 2 is a flowchart of a method 200 for assembling electron spin and charge to possess one or more properties of a lattice of topological plasmonic spin textures.

Figure 1C:
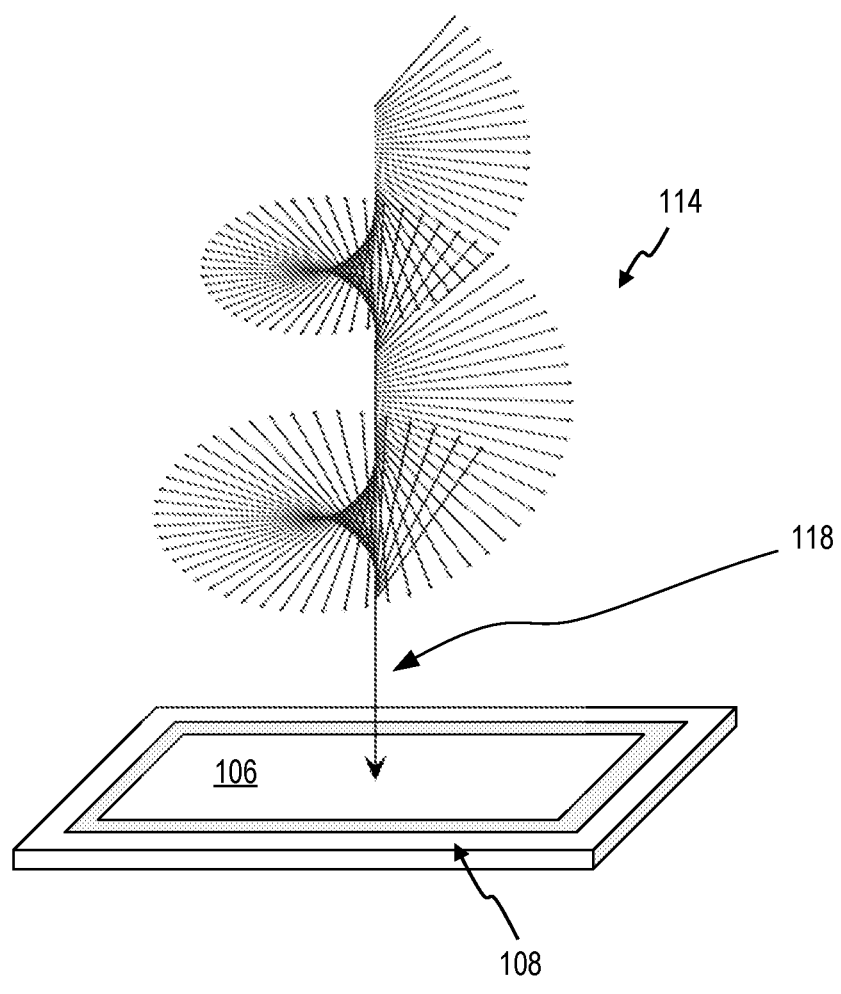
FIGS. 1C-1D are diagrams depicting the polarization and orbital angular momentum of the light beam of FIGS. 1A-1B.
Figure 1D:
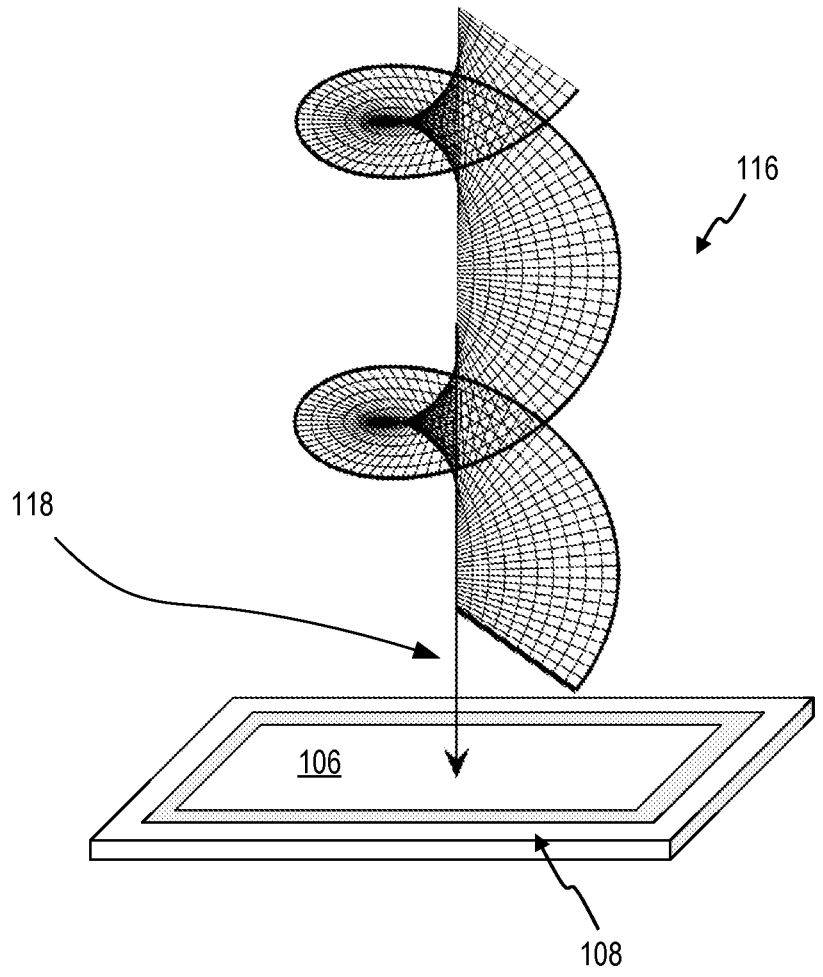

In particular, FIG. 1A provides a graphical representation of the light interacting with a coupling structure to form the array of plasmonic spin textures and resulting plasmonic lattice structure. FIG. 1B provides a flowchart representation of the components of the system 100 for assembling electron spin and charge. Referring to FIG. 1A, example system 100a includes a light source 102 (e.g., laser) configured to generate a light beam 104 (e.g., laser beam). The light source 102 can be configured to generate a light with variable wavelength (e.g., approximately 550 nm), variable pulse duration (e.g., approximately 20 femtoseconds), and/or variable polarization. The light beam 104 can have a spin and/or an orbital angular momentum. The example light beam 104 can have linear polarization, circular polarization, or elliptical polarization. For example, the light beam 104 can include circularly polarized light (CPL) pulses. CPL may include left circularly polarized (LCP) light and/or right circularly polarized (RCP) light. The system 100a can further include a surface 106 that includes one or more coupling structures 108 (e.g., nano-lithographically formed structures). The coupling structure 108 can have a geometrical charge based on the structure's geometry (e.g., dimensions, size, etc.). As an example, the coupling structure 108 can have a slit width and slit depth of approximately 100 nm. The geometry can define the spin orbit coupling, which can define the SPP fields and the plasmonic spin textures, as described further below. The structure 108 may be a polygonal structure. One such structure 108 may be a nanofabricated square coupling structure. Other examples of such a structure 108 may be a nanofabricated hexagonal coupling structure, triangular coupling structure, pentagonal coupling structure, heptagonal coupling structure. In some cases, the light beam 104 interacting with the structure 108 can lead to quasiperiodic patterns (e.g., as in quasicrystals). In some embodiments, each coupling structure 108 may be a slit in the surface 106. Each coupling structure 108 may be separated by the SPP wavelength, such that the SPP fields propagating from each coupling structure 108 are additive in-phase. In an example, the surface 106 can include three concentric coupling structures 108, where each coupling structure 108 is a square slit. In an example, the coupling structure 108 may have a width and a depth of approximately 100 nm. FIG. 1C illustrates the polarization 114 (also referred to as the spin) of the light beam 104. FIG. 1D illustrates the orbital angular momentum 116 of the light beam 104. The direction of travel (line 118) of the light beam 104 having polarization 114 and/or orbital angular momentum 116 is approximately orthogonal (e.g., +/−5 degrees of 90 degrees) to the surface of the coupling structure 108.

Note that the laser field may be continuous or pulsed. In an example, the light beam 104 may include CPL light pulses in a range of approximately 5-50 femtoseconds in duration. In an example, the CPL light pulses may have an approximately 20 femtosecond duration. The laser field may be visible, infrared, or ultraviolet and configured to have a wavelength greater than the surface plasmon resonance wavelength for the metal/dielectric surface. In an example, the light beam 104 may be comprised of visible light at a wavelength of 550 nm. In various embodiments, the laser field is coherent and overlaps with the metamaterial coupling structure. The decay length of the plasmonic field can be greater than or equal to one or more dimensions (e.g., diameter, width, or length) of the coupling structure 108. In some embodiments, the surface 106 includes a plasmonic material. For example, the plasmonic material can be a metal surface or a metal film (e.g., a silver surface or a silver film, respectively), where the plasmonic material is positioned atop a silicon substrate. In an example, the plasmonic material may be a 100 nanometer thick silver film. In some embodiments, the SPP waves and/or the plasmonic field can be transferred to another material in their near field proximity configured to support polariton excitations. For example, the other material can include a two-dimensional transition metal, dichalcogenide, graphene, a quantum material, and/or a semiconductor.

Referring to FIG. 2, in step 202 of method 200, the system 100 generates a light beam with a first spin and/or a first orbital angular momentum. When exposed to the light beam 104, in step 204 of method 200, the surface 106 is configured to enable excitations of SPP waves at metal-dielectric interfaces of the coupling structure(s) 108 to generate a plasmonic field. The metal-dielectric interfaces can have a geometrical charge, where the geometrical charge is based on the structure of the coupling structure(s) 108. The SPP waves (also referred to as wave packets or pulses) may carry a second spin and/or a second orbital angular momentum. Put another way, the surface 106 can add a second orbital momentum to the SPP waves, which carry the second spin. The SPP waves can propagate orthogonal to the geometry of the coupling structure(s) 108. The orthogonal propagation of the SPP waves can cause the SPP waves to interfere with a varying phase that is defined by the light beam 104. The interfering SPP waves can form a lattice structure of plasmonic vortices. The interference between SPP waves can thereby form a topological plasmonic lattice structure. The geometry of the plasmonic lattice structure may be based on the geometry of the coupling structure(s) 108. For the SPP waves, during each oscillation, the electric field of an SPP wave may cycle into and out of the plane of the surface 106. Such cycling may create a spin angular momentum (SAM) pseudovector that is transverse to the wave vector of the SPP wave. The plasmonic lattice structure may include oscillating SAM textures created by the rotating SPP waves. The SPP waves may circulate in clockwise and/or counterclockwise directions at alternating vortex cores. The SAM textures may be created from the circulation of the SPP waves. The SAM textures can have a transient, meron-like texture within each of one or more unit cells, where each unit cell may correspond to a plasmonic vortex within the plasmonic lattice structure. Topological singularities (e.g., L-line singularities and/or C-point singularities) may separate unit cells corresponding to different SAM textures. The SAM textures may be homotopic to that of a magnetic monopole (e.g., a magnetic meron). Unit cells of the lattice structure may have dimensions of approximately half the SPP wavelength. The plasmonic lattice structure may be most symmetrically defined for the central unit cell formed on the surface 106. The plasmonic lattice structure may extend to one or more unit cells surrounding the central unit cell. The meron-like textures within each unit cell may be formed on a nanometer scale and/or may remain stable on a time scale of the excitation pulse duration (e.g., approximately 20 femtoseconds). In other words, when exposed to the light beam 104, the surface 106 is configured to orthogonally focus the SPP waves from the boundaries of the coupling structure(s) 108 to form one or more plasmonic vortices (and the resulting plasmonic lattice structure). The plasmonic field may have a topological charge that is based on the second spin of the SPP waves, the second orbital angular momentum, and/or a geometrical charge of the surface. In some embodiments, the structures 108 include a surface plasmon phase-defining structure. Note that the phase of the SPP waves can be varied by the light's position on the coupling structure 108. The phase-defining structure may be a metamaterial.

The plasmonic spin orbit coupling between the second spin and the second orbital angular momentum can form an array of topological spin textures that are homotopic to that of a magnetic monopole. Put another way, each vortex photoemits electron beams and the monopole spin texture of the vortex is imparted to these electron beams. In some embodiments, the spin textures of the plasmonic field are based on (e.g., defined by) the sign and the magnitude of the optical field generating the plasmonic field. In some embodiments, the spin textures of the plasmonic vortices can have an integer or half-integer topological charge, corresponding to, respectively, a skyrmion or meron spin or field texture. In an example, the spin textures of the plasmonic vortices may have a half-integer topological charge with a meron-like spin texture. Depending on the clockwise or counterclockwise gyration of the vortices, the spin around the vortex converge to or diverge from (respectively) the core, where spin gradually rotates to point down or up (respectively). In some embodiments, the first spin may be related to and/or have the same characteristics of the second spin. In some embodiments, the first orbital angular momentum may be related to and/or have the same characteristics of the second orbital angular momentum.

Referring to FIG. 1B, example system 100b can include the light source 102 and coupling structure 108, as described above. In some embodiments, the system 100b can further include one or more optical devices 110 (also referred to as an optical system or "optics") such that the light 104 travels through the optics 110 before reaching the coupling structure 108. The optics 110 influence the spin and/or orbital angular momentum of the light 104. Example optics 110 can include one or more phase retarders, a vortex plate, and/or spatial light modulator. For instance, the optics 110 may be passive when a phase retarder is implemented. The optics 110 may be active when a spatial light modulator is implemented. The spatial light modulator can define how the light 104 hits the coupling structure 108, which can be beneficial in quantum computing applications, as described below. For example, the spatial light modulator can vary the light's position on the coupling structure 108, thereby affecting the phase of the SPP waves.

In some embodiments, the example system 100b can include an interferometer 112 positioned between the light source 102 and the coupling structure 108. If optics 110 is part of the system 100b, then the interferometer 112 is positioned between the light source 102 and the optics 110. The interferometer 112 can be used to collect information related to the light beam 104 contacting the coupling structure 108.

Detection Systems and Methods

Figure 3:
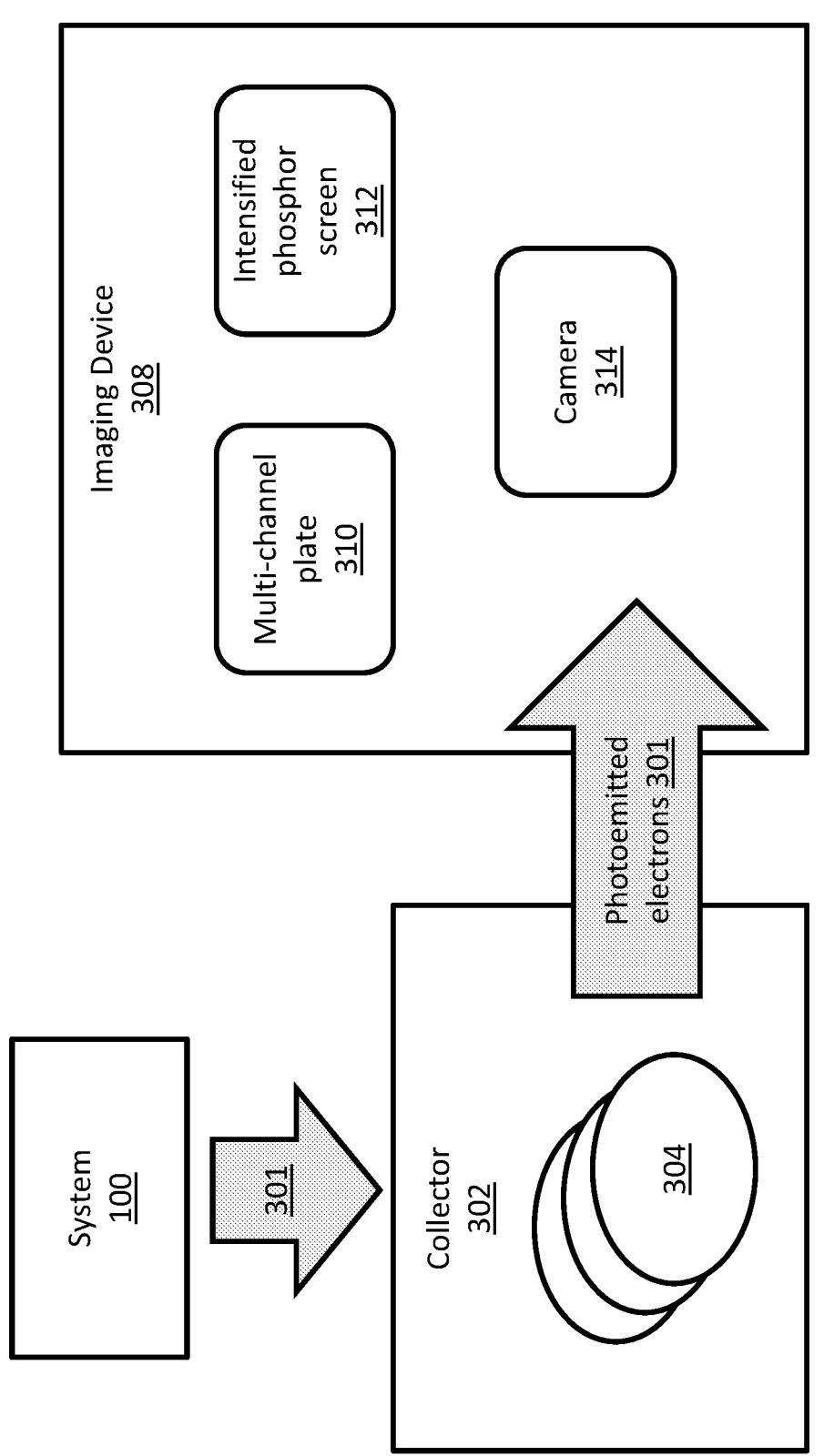
FIG. 3 is a diagram of an example system for detecting an assembled electron spin and charge possessing one or more properties of a plasmonic spin texture array.
Figure 4:
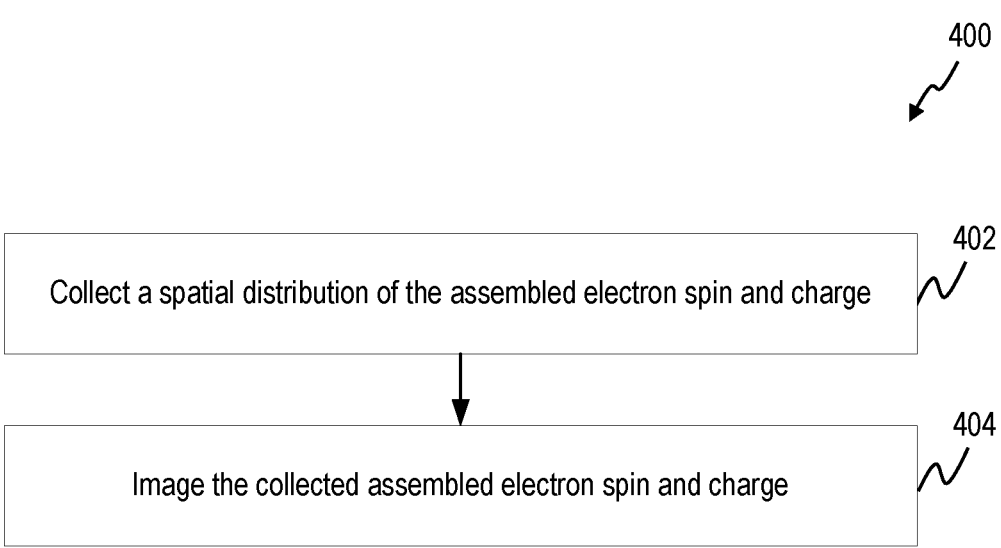
FIG. 4 is a flowchart of an example method for detecting an assembled electron spin and charge possessing one or more properties of a plasmonic spin texture array.

FIG. 3 illustrates a system 300 for detecting an assembled electron spin and charge possessing one or more properties of a lattice of topological plasmonic spin textures. FIG. 4 illustrates a method 400 for detecting an assembled electron spin and charge possessing one or more properties of a lattice of topological plasmonic spin textures. For the purposes of clarity and conciseness, FIGS. 3-4 are discussed together herein.

As described in more detail above, example system 100 can produce the assembled electron spin and charge 301. The example detection system 300 includes a collector 302 configured to collect the spatial distribution of the assembled electron spin and charge (step 402 of method 400). The collector 302 can include one or more electromagnetic lenses 304 configured to direct the photoemitted electrons 301 (the assembled electron spin and charge) onto the imaging device 308. An example collector 302 can include up to three (3) lenses, up to five (5) lenses, up to ten (10) lenses, up to fifteen (15) lenses, etc. In some implementations, the collector 302 includes thirteen (13) electromagnetic lenses and two (2) magnetic lenses. In some implementations, the system 300 includes aberration correction optics, which are configured to improve the spatial resolution. Directing the photoemitted electrons 301 may include reflecting and/or refracting the photoemitted electrons 301.

Figure 5:
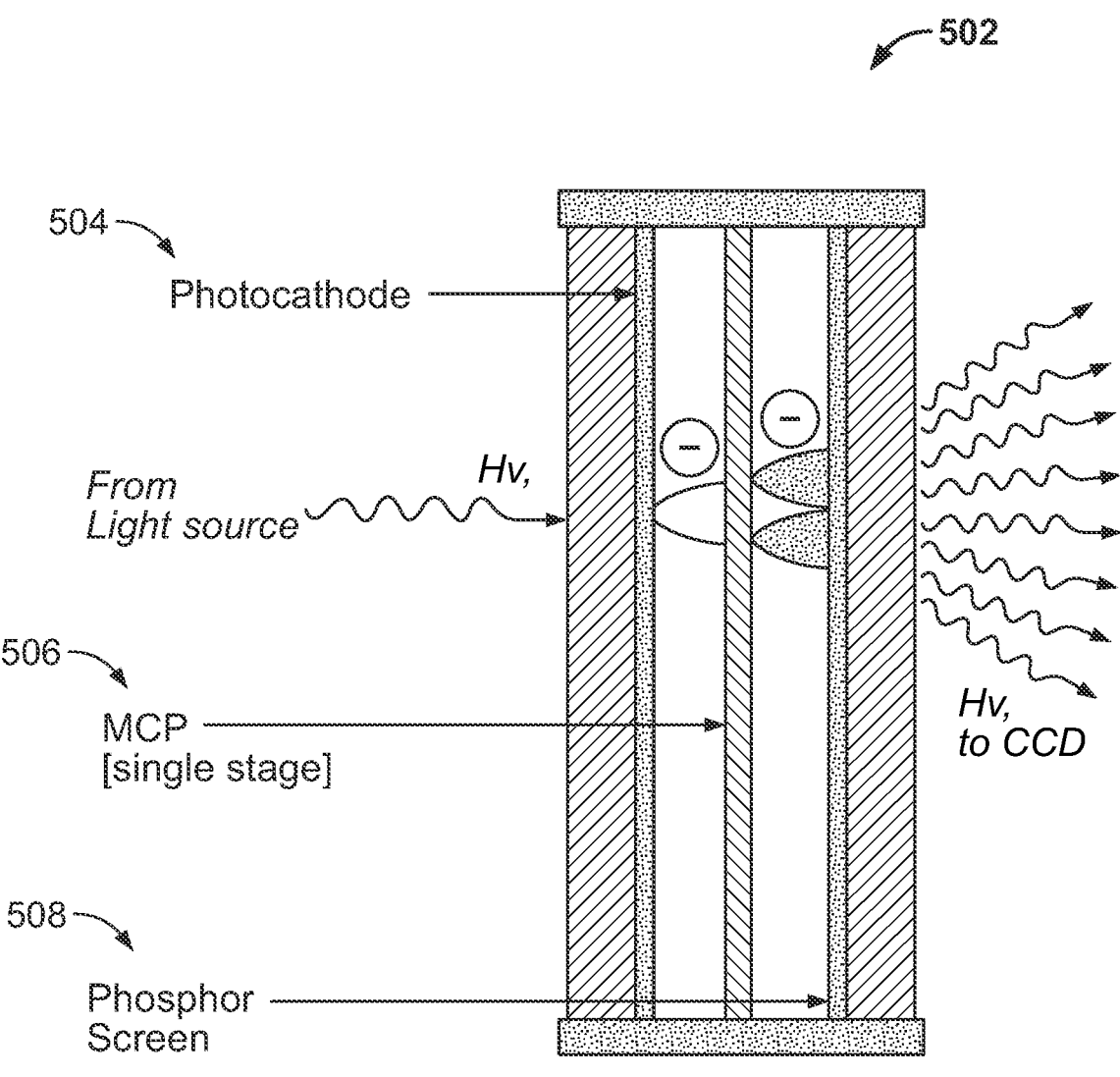
FIG. 5 is a diagram of an example multi-channel plate that can be used in the system of FIG. 3.

The example detection system 300 includes an imaging device 308 configured to image the collected assembled electron spin and charge 301 (step 404 of method 400). In some embodiments, the electromagnetic lenses 304 of the collector 302 are configured to amplify the photoemitted electrons 301. In some embodiments, the imaging device 308 includes a multi-channel plate 310, an intensified phosphor screen 312, and camera 314. FIG. 5 illustrates an example multi-channel plate 502 that can be used in system 300. As shown in FIG. 5, the example multi-channel plate 502 may include a photocathode 504, a micro-channel plate 506 including one or more (e.g., 1, 2, 3, etc.) stages, and a phosphor screen 508. Example multi-channel plate 502 is configured to multiply incoming electrons (from a light source) for detection by camera 314 (e.g., a charge-coupled device (CCD) as shown in FIG. 5). For example, the photoemitted electrons 301 can be imaged by interferometric time resolved photoemission electron microscopy (ITR-PEEM).

In some embodiments, the imaging device 308 is configured to image the collected assembled electron spin and charge over a time period defined by the laser field and/or the plasmonic field decay. In various embodiments, the time period is defined by the pulse width (e.g., approximately 20 femtoseconds) of the laser field. The example imaging device 308 can be configured to integrate over multiple laser pulses at a repetition rate (e.g., repetition rate of approximately 1 MHz or higher). Because the plasmonic field has a certain lifetime before it attenuates by transferring energy back to the metal (e.g., of the surface 106), the time period can be limited by the lifetime of the plasmonic field. Note that the decay length of the plasmonic field can be greater than or equal to one or more dimensions (e.g., radius, diameter, width, etc.) of the coupling structure 108. If the pulse duration is shorter than the plasmonic field lifetime, then the vortices may have a duration defined by the plasmonic field lifetime. If the pulse duration is longer than the plasmonic field lifetime, then the system can control the plasmonic field lifetime and the electron beam duration by changing the pulse duration. When the plasmonic field is decaying, the vortices may be expected to be present as long as the optical field is delivered.

Applications

The assembly of electron spin and charge to form the lattice of topological plasmonic spin textures can be used in a variety of applications. For instance, applications include electron beam imaging of magnetic materials, quantum communication, information processing, and information transfer. Additional applications can include control of: surface chemistry, deep-subwavelength resolution optical lithography, generation of vortex OAM electron beam arrays, and monopole-like spin textures. Specifically, the magnetic monopole is a permitted but non-existing element of Maxwell's equations of electricity and magnetism. Including a magnetic monopole element in Maxwell's equations affects the determination of how electric fields, magnetic fields, and electron charges interact with matter and, in return, affects the determination of how the monopole element affects the electric fields, magnetic fields and electron charges that interact with matter.

In some embodiments, the spin of the SPP waves within the plasmonic lattice structure may be configured to carry and process information for quantum computing. The electron spin can function as a q-bit in quantum computation, where the magnetic monopole spin texture (e.g., meron-like spin texture) can perform quantum logic gate operations on materials in its near-field. For instance, a generated monopoles of the array could each encode its spin and topological charge to an electron pulse on 20 femtosecond time scale. This is faster than the 1000 fs or longer scale required for information writing using magnetic counterparts. In another function, the monopole spin textures can generate photoelectron vortex pulses that propagate freely in ultrahigh vacuum with a profile defined by their Bessel function spatial distributions, which make their propagation self-healing and non-diffracting. These properties are attractive for quantum information encoding and transfer. This is because the signal for information transfer may experience obstacles that deteriorate the quality of the signal. Self-healing can be beneficial to reconstruct the pulse to its original quality after being affected by an obstacle, thereby providing protection against degradation by environmental obstacles and/or interfering interactions.

In some embodiments, the topological singularities (e.g., L-line singularities and/or C-point singularities) between different spin textures within the lattice of topological plasmonic spin textures may be configured for lithography (e.g., deep-subwavelength resolution optical lithography). Use of the phase discontinuities between spin textures for lithographic purposes can be accomplished with photoresist materials (e.g., chiral photoresist materials) that respond to the spin of the optical field (e.g., from the light beam 104). In an example, chiral photoresist materials may respond to RCP and LCP polarizations from the light beam 104, such that the L-line and C-point singularities separating SAM textures (e.g., unit cells of different SAM textures) may be used to produce lithographic structures on a nanometer or sub-nanometer scale.

Additional detail related to the systems and methods described herein can be found in the following sections.

Ultrafast Microscopy of a Plasmonic Spin Skyrmion

We introduce a topological quasiparticle possessing plasmonic skyrmion-like spin texture at a surface plasmon polariton (SPP) vortex by analytical theory and imaging of its ultrafast nonlinear dynamics by interferometric time-resolved photoemission electron microscopy (ITR-PEEM). We show that upon exciting a nanofabricated circular coupling structure with ultrafast circularly polarized light (CPL) pulses, their spin angular momentum (SAM) generates SPP wave packets with orbital angular momentum (OAM). Subsequently, the SPP pulses propagate radially to come to a focus in a plasmonic vortex. We record movies of the nanofemto coherent SPP wave packet field propagation by imaging the spatial evolution of the nonlinear two-photon photoemission (2PP) in response to a changing delay between identical pump and probe pulses. The movies record how spin-orbit interaction (SOI) of the focusing waves evolves in space and time by recording the interference between the optical and SPP fields. Analytical modelling describes how the radial SPP field propagation, and the orbital gyre imparted by SAM of the optical field, warp the transverse spin of the evanescent SPP waves into a quasi-particle with SAM texture that has homotopic topology at the vortex core to a twisted magnetic skyrmion. This plasmonic skyrmion is defined within contours of the linear SPP polarization known as L-line singularities. Moreover, we establish that the dielectric discontinuity between topologically trivial Ag and vacuum environments supports a pair of twisted skyrmions with the opposite topological charge composing a magnetic monopole-hedgehog texture, with a SAM singularity at the vortex core. The monopole-like spin texture forms a nonlinear source of photoelectrons with OAM. The designed plasmonic topological SAM textures break the time-reversal symmetry, can impose their topological charge onto trivial materials in their near field entangling the electron spin-momentum degrees of freedom, and drive spin-Hall currents.

Topological solitons are singular field distributions implicated in contexts of structure formation and phase transitions ranging from nucleons, cosmology, magnetism, liquid crystals, to quantum fluids. Skyrmions were first proposed as homotopically nontrivial differential vector field theoretic descriptors of the structure of nucleons, and later their mathematical form found a more accessible homotopes in condensed mater contexts as stable spin textures in chiral magnets, Bose-Einstein condensates, molecular orientational orders in liquid crystals, and plasmonic field and spin textures.

In phase diagrams of ferromagnetic materials, skyrmion spin textures exist as stable domains that form through spin-spin interaction. Because their creation, annihilation, and transport respond to applied fields, and their topology protects them from impurities and defects, they are attractive as bits for magnetic storage, and in other quantum spintronic contexts. The magnetic skyrmion spin textures can be imaged in real space by spin sensitive microscopy such as the Lorentz, soft X-ray, spin-polarized scanning tunneling, spin-polarized low energy electron, etc., or by diffraction in the reciprocal space. While revealing the topological spin textures, such methods have not resolved their creation, annihilation, and transfer dynamics.

Static optical topological field distributions such as edge states, have been imaged in metamaterial constructs. The ultrafast dynamical creation and imaging of topological textures, especially for 2D surface electromagnetic modes such as SPPs at topologically trivial metal/dielectric interfaces, opens the possibility to switch on and off the nonreciprocal response of matter by application of topological fields, and observe the consequent dynamics in space and time.

SPPs are electromagnetic waves with a composite charge density wave/optical field character supported on metal/dielectric interfaces by a change in sign of the real parts of dielectric functions. The inextricable topological nature of SPPs derives from their SAM, which is transverse to its propagation vector, $k_{SPP}$, and together with their electric field, $E_{SPP}$, form a chiral triad of vectors. As SPPs propagate, their $E_{SPP}$ polarization revolves from transverse to longitudinal, with the interface amplitudes given by the ratio

11

~$\varepsilon_m/\varepsilon_d$, defining their transverse SAM. The chiral nature of SPPs mandates the plasmonic spin-Hall effect where reversing $k_{SPP}$ changes the sign of its SAM. Moreover, their SAM textures can be created and evolve on the femtosecond time scales as defined by the generation pulse time structure, geometry of the $k_{SPP}$ distribution, phase of the interfering fields, and dephasing of $E_{SPP}$.

Complex electromagnetic phenomena such as plasmonic vortices that entail the plasmonic spin-Hall effect, can be designed by structuring of the SPP phase fronts in space and time. Topological plasmonic fields and SAM textures have been generated by optical excitation of lithographically textured metal surfaces and imaged by near-field optical or nonlinear photoemission electron microscopy methods. By employing continuous wave or femtosecond light sources, topological fields can be generated, potentially function as information bits, aid in Fourier image processing, and perform as active switching nodes in information storage and processing.

When topological fields are impressed on matter, they can be investigated in dynamical contexts where their SAM textures are created and persist on few femtosecond timescales, enabling them to interact among themselves or with materials in their optical near field. Therefore, the strong plasmonic fields associated with the SAM textures can drive correlated dynamical processes, such as topological phase transitions, and nonreciprocal electromagnetic responses, as well as impart topological properties to trivial materials through Floquet engineering to realize and control topological quasiparticle functions; their SAM textures are particularly interesting for the interaction with and control of the spin-valley degree of freedom in 2D semiconductors, and to expand repertoires of optoelectronics, photocatalysis, and topological photonics. In breaking the time reversal symmetry (TRS), plasmonic skyrmions may also find applications in coherent gyromagnetic devices, and in generation of charged particle vortices.

Here, we describe a general analytical model for the design of the structure and dynamics of plasmonic topological spin textures. Based on the Huygens principle of wave superposition, we describe how the phase vorticity created by illumination of a circular metallic coupling structure by circularly polarized light (CPL), leads to formation of a plasmonic vortex at its center. The optical CPL field interacting with a lithographically defined coupling structure converts the longitudinal SAM quanta, $\sigma\hbar$ ($\sigma=\pm1$), into a plasmonic vortex with OAM of $L=\pm1$. When the propagating SPP fields converge into a vortex, the SOI of light twists the transverse SAM from in-plane to project into the vacuum thereby forming a chiral skyrmion-like texture, which is homotopic to a magnetic twisted SAM skyrmion, and hereafter we will refer to it simply as skyrmion. We characterize the topological character of the skyrmion by its periodic boundary that is defined by contours of linear polarization referred to as the L-line optical singularity; across such boundary, the normalized SAM along surface normal is discontinuous as a consequence of counterrotating SPP field circulations. Because the plasmonic SAM skyrmions are created by interference, the L-lines boundaries are periodic, forming concentric rings centered on the vortex core.

In addition to the SAM texture in the dielectric phase, a complimentary and inseparable texture forms within the metal, but with the opposite skyrmion number. This skyrmion pair is a topologically protected state due to an inversion symmetry breaking by the change in sign of the dielectric constant across the interface; this is an intrinsic property of surface Maxwell waves, where the spin topology is defined by the light helicity. Moreover, within the primary vortex ring, the SAM texture across the interface is that of a spin hedgehog with a spin singularity at the vortex core breaking the TRS at the interface; it is a plasmonic analog of emergent magnetic monopole in topological surface states, and hedgehog spin textures of electronic bands in TRS broken massive Dirac materials. The hedgehog spin texture acts as a source where 2PP transfers the OAM of the SPP field to photoemitted electrons, similar to the inverse process where a magnetic monopole imparts an Aharanov-Bohm phase to freely propagating electrons to produce electron vortex beams.

To generate with the nanometer and femtosecond (nanofemto) resolution ultrafast movies of the creation, evolution, and decay of the plasmonic SAM skyrmion, we employ the ITR-PEEM method. This ultrafast microscopic technique directly captures the evolution of the SPP vortex field by recording the distribution of photoelectrons emitted from sample surfaces through the coherent nonlinear annihilation of two photons from phase-corelated plasmon and photon pump-probe fields. We apply this coherent ultrafast microscopy to record movies of the amplitude and phase of the SPP fields, from which, based on a Maxwell's equation modeling, we deduce the transient formation of a plasmonic SAM skyrmion texture. The derived plasmonic SAM distribution, consistent with our analytical model, directly defines the $L=\pm1$ vectorial spin texture at the core of the plasmonic vortex on the femtosecond time scale. The observed plasmonic SAM skyrmions are transiently created and dissipate on time scale of the optical pulse duration, providing a platform for studies of their ultrafast TRS breaking, in high-field, nonreciprocal, quantum light-matter interactions.

SPPs are hybrid waves with dual electromagnetic field and charge density fluctuation character at metal/dielectric interfaces. In the propagation direction their amplitude is damped, hence their wavevector, $k_{SPP}$, is complex, and normal to the interface they are evanescent, hence $\kappa$ is imaginary. The general expression for SAM, S, is given by Equation 1, $$S \sim \frac{1}{4\omega}\mathrm{Im}[\varepsilon(E^* \times E) + \mu(H^* \times H)] \tag{1}$$

where $\omega$ is the frequency of the time-dependent electric E and magnetic H fields, the asterisks indicate complex conjugation, and $\varepsilon$ and $\mu$ are the permittivity and permeability of the supporting materials. In the case of SPPs, the vectorial properties of S are different across the dielectric/metal interface, because the permittivity must change signs to support them; the component materials are non-magnetic, $\mu=1$, and the permittivities are those of the bulk values $\varepsilon_{m(d)}$ metal (dielectric), not considering that the interfacial dielectric responses may be nonlocal. When CPL light with helicity $\sigma$ illuminates a circular slit structure (element 602), which is fabricated by focused ion beam milling of an otherwise flat Ag film on a Si substrate, SPP waves are coupled and launched from its edges such that their out-of-plane, $E_z$ field accumulates a $2\pi$ phase along its circumference during one cycle of its oscillation; this generates an SPP wave with a light helicity dependent OAM of $L=\sigma$. The circular polarization together with the circular coupling structure focus the $E_z$ component of the SPP field to a phase singularity at the vortex core, where its amplitude is zero and phase is undefined. The force of such vortex fields can rotate nanoscale objects, and drive circulating electron currents.

Figure 6:
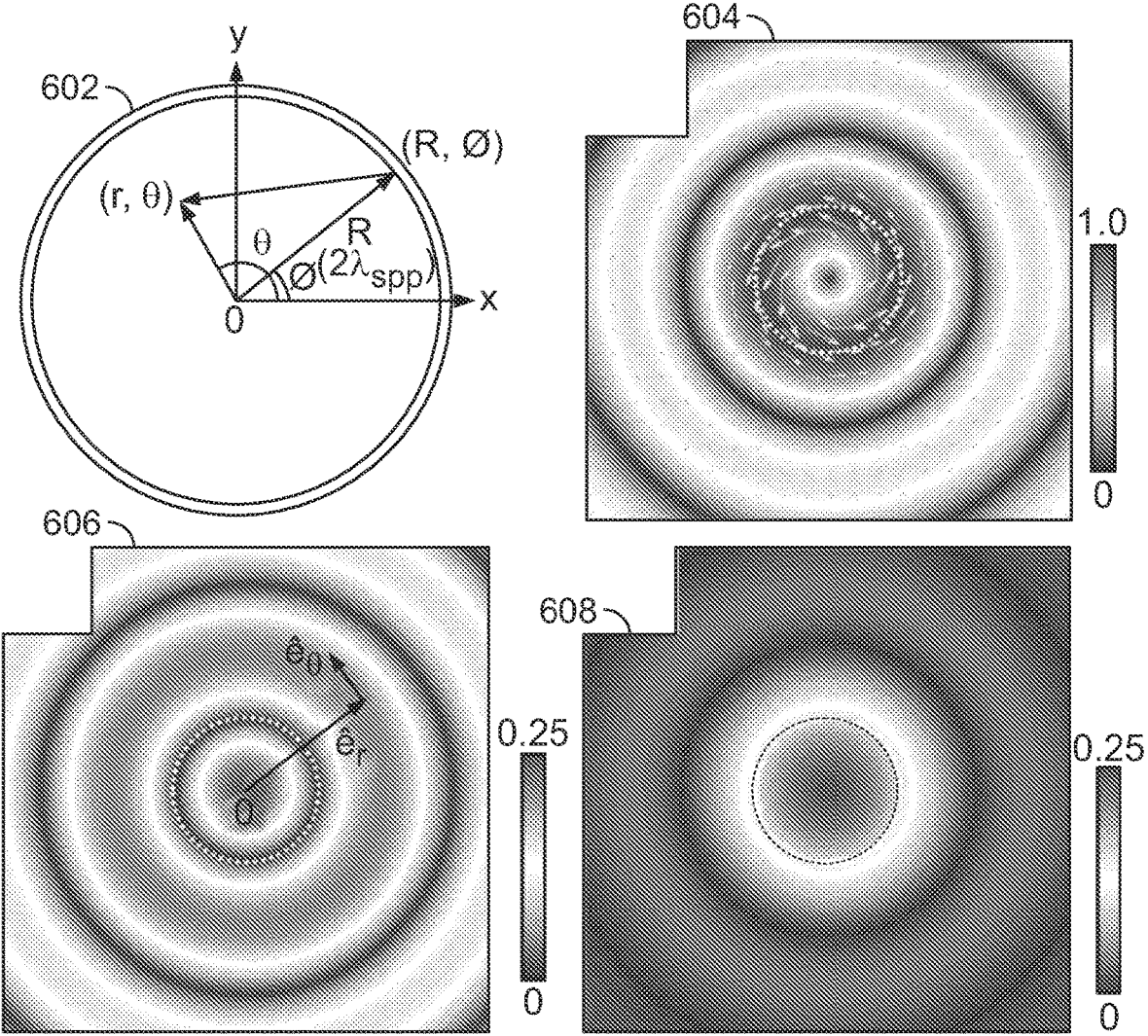
FIG. 6 is a diagram of a coupling structure for generating SPP waves.

FIG. 6 is a diagram of coupling structure for generating SPP waves. Element 602 as shown in FIG. 6 defines the coupling structure geometry and cylindrical coordinates that describe the SPP field excitation and propagation. Element 602 shows a schematic of the SPPs ring coupling structure with $R=2\lambda_{spp}$ and definition of the SPP generation and propagation coordinates. The coordinates r and $\theta$ describe the SPP field, while the radius R and azimuthal angle $\emptyset$ define coupling structure. The helical optical field propagation in the −z-direction to interact with the coupling structure is described by $$E_{ex} = \frac{1}{\sqrt{2}} e^{\pm i\emptyset} (\hat{e}_R + i\hat{e}_\emptyset) e^{i(k_L \cdot z - \omega_L t)},$$

where $\hat{e}_R$ and $\hat{e}_\emptyset$ are the radial and tangential unit vectors, and $k_L$ and $\omega_L$ are the light wavevector and frequency, respectively. For an infinitesimally thin radial coupling slit, however, only the radial in-plane circulating component of the helical optical field couples to form SPPs that propagate toward the structure center forming a phase spiral with a singularity at the core. The vacuum light wavelength is $\lambda_L$=550 nm, corresponding to that of SPP of $\lambda_{SPP}$=530 nm; the model, however, is universal for any excitation wavelength or material that supports SPPs.

Element 604 shows the $|E_z|$ component of the SPP field (color scale, normalized to 1) generated by illumination of the coupling structure with counterclockwise (left) circularly polarized $\sigma$=−1 light; the dashed circle (also, in FIG. 7 and FIG. 11) marks the first maximum of $|E_z|$ at $r_1\approx0.29\lambda_{spp}$ (the primary vortex ring). The field forms a vortex with a phase singularity at the center (focus) where destructive interference forces $|E_z|$=0. The superposed arrows represent the Poynting vectors near $r_1$ for L=−1.

Element 606 shows the $|E_r|$ field, being spatially shifted by ¼ of the Bessel function wavelength from $E_z$, interferes constructively at the vortex core, and destructively at $r_1$. The unit vectors, $\hat{e}_r$ and $\hat{e}_\theta$ indicate the polar coordinates with origin at the vortex.

Element 608 shows the $|E_\theta|$ field is less tightly focused at the vortex core than in $|E_r|$, and decays in outward direction more slowly. The color scales of elements 606 and 608 are amplified 4× with respect to element 604.

The SPP field is described by the transverse $E_z$ component coupled at radius R as $E_{0z}e^{i(\emptyset-\omega_{spp}t)}e^{-\kappa Z}Rd\emptyset\hat{z}$, where $E_{0z}$ is the initial amplitude, $e^{i(\emptyset-\omega_{spp}t)}$ is their time and radial angle dependent phase oscillating with a frequency $\omega_{spp}=\omega_L$, $e^{-\kappa Z}$ is their evanescent attenuation in vacuum normal to the interface, and $Rd\emptyset$ is an infinitesimal linear increment along circumference of the coupling structure. Applying the Huygens principle, the coupling structure is modeled as an array of point sources along its circumference from which SPP waves emanate with a varying phase when exposed to CPL light. The SPP fields at the vortex core are obtained by propagating and integrating the contributions from each point source with its appropriate phase.

In the following, we only consider the limiting z=0 fields at the interface, because it generates the 2PP signal. To calculate the $E_z$ field near the vortex core, the amplitudes of all point sources are integrated; to obtain the longitudinal components, however, it requires integration of the radial and tangential vector projections; this introduces a dot product, $$\hat{e}_r \cdot \frac{r\hat{e}_r - R\hat{e}_R}{R},$$

where the radial coordinate $\hat{e}_r$ is defined in element 606 of FIG. 6.

Figure 7:
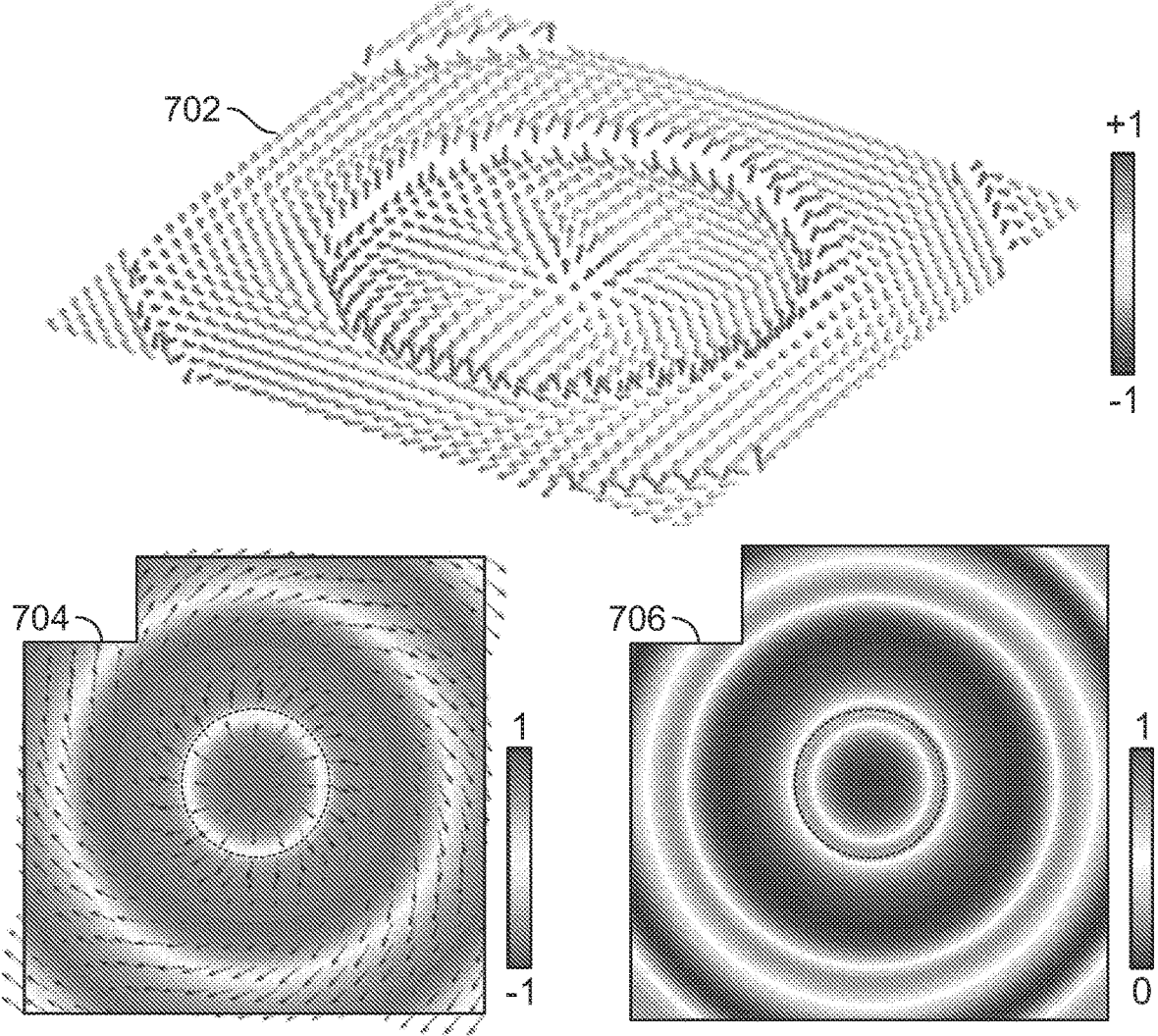
FIG. 7 is a diagram of representation of spin angular momentum (SAM) at a vortex of a plasmonic skyrmion.

FIG. 7 is a diagram of representation of SAM at a vortex of a plasmonic skyrmion. Element 702 shows a 3D representation of SAM at the vortex of an L=−1 plasmonic skyrmion. The color scale indicates the magnitude of $S_{z,n}$. Element 704 shows the amplitude of $S_{z,n}$, and directions of the in-plane SAM, $S_{\|,n}$, respectively, which are indicated by the color scale and arrows. Element 706 shows the normalized amplitude distribution of $S_{\|,n}$, which is maximized at the primary vortex ring. The dashed circles in elements 704 and 706 indicate the vortex ring at $r_1$.

For the L=−1 plasmonic vortex, the field amplitudes on the vacuum side can be expressed by Equations 2a, 2b, and 2c, where $0^+$ refers to the dielectric side, $\varepsilon_0$ ($\varepsilon_d$) is the absolute (relative) permittivity of the vacuum, and $J_v$ is a Bessel function of the first kind of order v that is determined by the OAM of the orbiting $E_z$ component, i.e., v=L. The Bessel function describes the SPP field distribution in the interface plane.

$$E_z(r, \theta, 0^+) = i\frac{2\pi R k_{SPP}}{\omega_{SPP}\varepsilon_0\varepsilon_d}e^{ik_{SPP}R}e^{i\theta}J_1(k_{SPP}r) \tag{2a}$$

$$E_r(r, \theta, 0^+) = \tag{2b}$$

$$-\frac{\pi i\kappa}{\omega_{SPP}\varepsilon_0\varepsilon_d}e^{ik_{SPP}R}e^{i\theta}[2irJ_1(k_{SPP}r) + R(J_0(k_{SPP}r) - J_2(k_{SPP}r))]$$

$$E_\theta(r, \theta, 0^+) = \frac{\pi\kappa R}{\omega_{SPP}\varepsilon_0\varepsilon_d}e^{ik_{SPP}R}e^{i\theta}[J_0(k_{SPP}r) + J_2(k_{SPP}r)]. \tag{2c}$$

Note, that the magnetic field associated with the plasmonic vortex also has an orbiting motion described by Bessel functions, but we assume it does not contribute to the 2PP signal. The distribution of $|E_z|$ from Equation 2a, which is the vortex field carrying an OAM of L=−1, is plotted in element 604 of FIG. 6 for $R=2\lambda_{SPP}$; it shows that $|E_z|$ reaches its maximum, as defined by Bessel functions, at $J_1(k_{SPP}r)$, or $k_{SPP}r_1\approx1.84$. From this we establish that the radius of the vortex hereafter, occurs at $r_1\approx0.29\lambda_{SPP}$=150 nm (dashed circle; henceforth, the primary vortex ring). The superposed arrows in element 604 indicate the Poynting vectors, corresponding to a counterclockwise (CCW) propagation of the SPP field at the vortex ring. Because the SAM is locked transverse to the $k_{SPP}$, its association with the plasmon vortex is obtained from the right-handed rule, which specifies for a CCW field circulation, that it points from the metal to the dielectric (+z) at the vortex core, and moving outward, it diverges to lie in the surface plane, pointing away from the core at the vortex ring as shown in element 704. Reversing the light helicity $\sigma$, obtains the opposite L=+1 vortex (not shown), where at the vortex core, the transverse SAM points into the metal (−z) and at the ring it points towards the core. The SPP SAM direction at the vortex core is the same as for freely propagating CPL light that excited it.

To relate the overall SAM topology with respect to the ITR-PEEM imaging, we also need to evaluate the longitudinal ($E_\|=E_r+E_\theta$) SPP field components. For the |L|=1 SPP vortex, the radial ($|E_r|$) and tangential ($|E_\theta|$) field amplitudes are plotted in elements 606 and 608 of FIG. 6. By contrast to $|E_z|$, which is extinguished at the vortex core, the $|E_r|$ component is focused to a maximum. Moreover, the $|E_r|$ passes through zero at $r_1$, as expected from the tangential Poynting vectors of the SPP field.

Moreover, the $|E_\Theta|$ component also has a focus at the vortex core, but diminishes more slowly in the outward direction than $|E_r|$. This tangential field orbiting is a manifestation of the circulating $k_{SPP}$-vector. The minimum of $|E_\Theta|$ occurs at $r_2 \approx 0.61 \lambda_{SPP} = 320$ nm, which is a zero of the $J_1(k_{SPP}r)$ Bessel function. While the circular standing wave patterns in FIG. 6 show the time-integrated plasmon field components, their dynamical properties are determined by the Poynting vectors [the arrows shown in element 604].

Having defined the vectorial SPP field components of an $L=-1$ vortex in Equations 2a-2c and FIG. 6, we next use them to calculate the associated SAM profile; according to Equation 1, the SAM components on the vacuum side of the interface are defined by Equations 3a, 3b, and 3c:

$$S_r(r, \theta, 0^+) = \frac{8\pi^2 R^2 \kappa}{\omega_{SPP}^2 \varepsilon_0 \varepsilon_d} \frac{J_1^2(k_{SPP}r)}{r} \tag{3a}$$

$$S_\theta(r, \theta, 0^+) = -\frac{8\pi^2 R r k_{SPP} \kappa}{\omega_{SPP}^2 \varepsilon_0 \varepsilon_d} J_1^2(k_{SPP}r) \tag{3b}$$

$$S_z(r, \theta, 0^+) = 2\pi^2 R^2 \left( \frac{\kappa^2}{\omega_{SPP}^2 \varepsilon_0 \varepsilon_d} + \mu_0 \right) [J_0^2(k_{SPP}r) - J_2^2(k_{SPP}r)]. \tag{3c}$$

The $S_z$ component in the metal side ($0^-$) has an equivalent form, but the $\varepsilon_d \to \varepsilon_m$ substitution below the plasma frequency of a metal reverses its sign. This is strictly a property of SPP fields, which are supported on metal/dielectric interfaces only when their dielectric functions have the opposite sign.

Based on Equations 3a-3c, we plot the corresponding normalized 3D vacuum-side SAM texture, $$S_n = \frac{S}{|S|}$$

as shown in element 702, which is homotopic to a twisted magnetic skyrmion. In this texture, SAM points up at the vortex core and reorients to pointing down at its periphery, as will be elaborated further. The continuous reorientation of the normalized SAM is illustrated in element 704. Because $J_1(k_{SPP}r)$ reaches maximum at $r_1$, according to the recurrence relation of Bessel functions, $$J_0^2(k_{SPP}r) - J_2^2(k_{SPP}r) \sim J_1(k_{SPP}r) \frac{dJ_1(k_{SPP}r)}{dk_{SPP}r}, S_{z,n}$$

is zero at the $J_1(k_{SPP}r)$ extrema, i.e., at $r_1$ (in Equation 3c). Proceeding from $r_1$ to a larger r, $S_{z,n}$ becomes negative, and completes a full $\pi$ rotation at $r_2$. The in-plane component of the normalized SAM, $S_{\parallel,n} = S_{r,n} + S_{\theta,n}$, which is represented by arrows in element 704 and is described by $$J_1^2(k_{SPP}r),$$

is spatially shifted with respect to $S_z$ by ¼ period of the Bessel function. Consequently, its amplitude changes from zero at the vortex core, to maximum at $r_1$ where $$\left. \frac{dJ_1(r)}{dr} \right|_{r_1} = 0,$$

and back to zero at $r_2$. The distribution of the in-plane SAM $|S_{\parallel,n}|$ is shown in element 706, where one sees that its maximum is at $r_1$, which derives from the maximum in $E_z$; the radial component of the SAM, by contrast, is generated by a cyclical oscillation between the $E_z$ and $E_\theta$ fields. Note that there is also a non-zero tangential component of the SAM, which is evident as a twist of $S_{\parallel,n}$ from the radial direction in element 704 and is proportional to dimension of the vortex; it appears because r is not treated as a negligible quantity with respect to R in deriving the Bessel function orders. Therefore, the finite $S_\theta$ component of SAM for coupling structures where r~R, turns SAM away from a Néel type, towards a twisted skyrmion texture of a Bloch-type character. The R-dependent SAM twist angle is quantified as described herein.

FIG. 8 is a diagram of characteristics of a plasmonic skyrmion. Element 802 shows the plasmonic skyrmion density D distribution, which peaks at $r_1$ where $S_z=0$. Element 804 shows a Poincaré sphere of the SPP field polarization, where $S_1$, $S_2$, $S_3$, are the Stokes parameters. The arrow indicates the equator, which defines the SPP field polarizations at the L-line singularity, along which the linear polarization rotates by $2\pi$. The north and south poles correspond to the C-point singularities that define the core and boundary of the plasmonic SAM skyrmion. Element 806 shows a map of the L-line singularities, where the bright contrast rings, centered on the C-point singularity (the point marked by C) at the vortex core, identify interfaces where the in-plane plasmonic fields are dominantly linearly polarized corresponding to the poles or equators of the Poincaré sphere. The inner L-line ring occurs at $r_1$, where the skyrmion density is also maximum, while the second one marked by a dashed circle forms the skyrmion boundary at $r_2$. The L-line singularities that keep repeating beyond $r_2$, alternate between defining the skyrmion density maxima, and their boundaries. The dashed lines in elements 802 and 806 represent the skyrmion boundaries at $r_2$.

To establish that the topological character of the plasmonic SAM texture is nontrivial, we first calculate the charge density, D, as defined by Equation 4, $$D = \frac{1}{4\pi} S_n \cdot \left( \frac{\partial S_n}{\partial x} \times \frac{\partial S_n}{\partial y} \right) \tag{4}$$

where $S_n$ is the normalized SAM at each pixel of evaluation in Cartesian coordinates. The calculated distribution of D in the x, y space for $L=-1$ vortex for $R=2\lambda_{spp}$ is shown in element 802. Evidently, D has a radial symmetry, with its magnitude determined by the amount of solid angle the plasmonic spin covers within infinitesimal spatial increment.

Based on the wavelength of interferences emanating from of all of the SPP point sources that contribute to the Bessel function field distribution, we define a periodic boundary of the SAM skyrmion, similar to the interference of spin waves in magnetic skyrmion lattices: there a skyrmion unit is defined by a soliton solution of interfering waves with a defined wavelength. The first boundary is marked by the dashed circle of radius $r_2$ in element 802; integration of D within this area gives a topological charge of N=1 for the $L=-1$ plasmonic vortex, confirming the quasiparticle as a skyrmion. For an L=1 SPP vortex, the SAM pseudovectors are reversed, defining a skyrmion with topological charge of N=−1.

We further show that the boundary of a plasmonic SAM skyrmion is intrinsically associated with the second L-line polarization singularity fringe of the surface plasmonic fields. The L-line singularity defines the interface where the in-plane electric fields are linearly polarized, and consequently, the out-of-plane SAM passes through $S_z$=0. This represents the equator if the SPP polarization mapped onto a Poincaré sphere, along which the in-plane electric field components have pure linear polarization whose orientation rotates by $2\pi$, as shown in element 804. From this perspective, the pure positive $S_z$ component at the vortex core sits at the north pole, where the upper hemisphere bounded by the equator ($r_1$) encloses a half-skyrmion, and the pure negative $S_z$ resides at the south pole ($r_2$); the poles of the Poincaré sphere represent pure circular polarizations, or C-point singularities. Note that the out-of-plane SAM vanishes at the L-line, while the in-plane SAM component reaches maximum due to the cyclic motion of SPPs.

Figure 9:
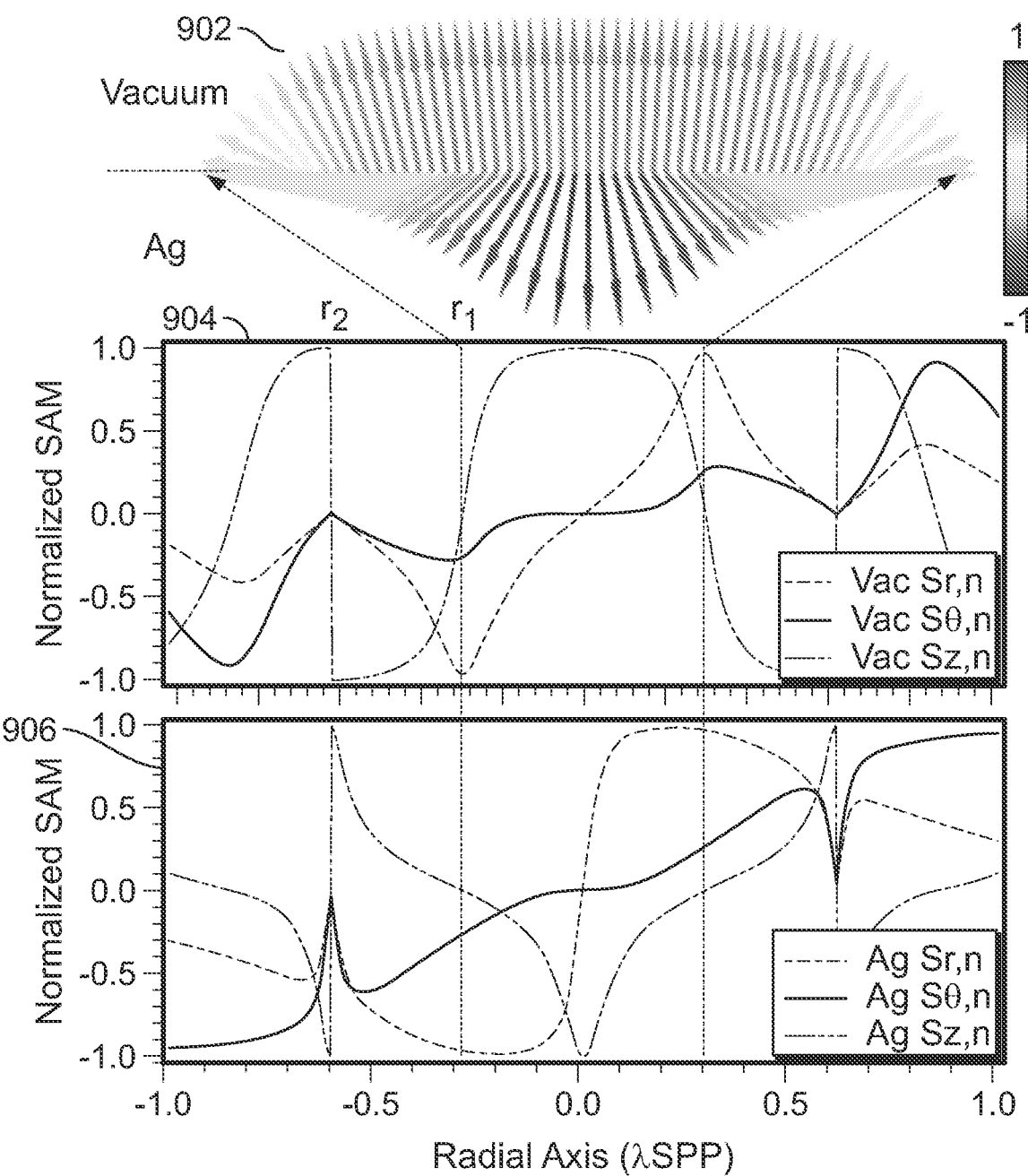
FIG. 9 is a diagram of a SAM hedgehog profile across a dielectric/metal interface.

FIG. 9 is a diagram of a SAM hedgehog profile across a dielectric/metal interface. Element 902 shows a SAM hedgehog profile across the dielectric/metal interface. The color scale indicates the $S_{z,n}$ magnitude. Elements 904 and 906 show the vacuum (Vac) and the metal (Ag) radial variation of the normalized SAM components in the cylindrical coordinates, respectively.

We numerically compute the L-line fringe distribution by calculating the ellipticity of the in-plane electric fields surrounding the vortex region, as shown in element 806. The minimum of ellipticity of 1 corresponds to a circular in-plane polarization, or a C-point singularity [the center in element 806]. Away from the C-point, the SPP field becomes more elliptical and eventually passes through an L-line singularity at $r_1$ [$S_z$→0 in element 704], or equator of the Poincaré sphere. The second L-line from the center marks (dashed circle in FIG. 8) the skyrmion boundary, where $S_{z,n}$→−1, and within which the spatial integral of D→−1. Therefore, the second L-line encloses the full skyrmion. This L-line exists where $S_{z,n}$ undergoes a $\pi$-phase jump across $r_2$ [as shown in element 704 and element 904], i.e., the $S_{z,n}$ vectors on each side of the boundary point in surface normal, but in the opposite directions. The anti-parallel $S^{z,n}$ vectors result from counterrotating in-plane fields on the opposite sides of $r_2$ that originate from the evanescent properties of SPPs. Therefore, the superposition of the oppositely circulating C-points at $r_2$ necessitates a transition through the linear polarization. Such a discontinuous transition in $S_{z,n}$ discussed above is a chirality discontinuity catastrophe, which occurs on the screening scale, and enables chiral interactions to achieve contrast with a deep subwavelength resolution. This implies that electrons passing through the singularity will experience a reversal in the electromagnetic reciprocity on the Thomas-Fermi screening scale.

The SPP skyrmion spin texture analysis illustrates the homotopy between the L-line mapping of the plasmonic skyrmions and the boundary of their textures, and defines a precise method to locate both their dominant density ($r_1$), as well as their boundary ($r_2$). Finally, because the L-line boundaries are periodic, the analysis of the topological texture of the vortex can be extended periodically outward, with the skyrmion number equaling to the number of periodic textures that are enclosed.

One notable aspect of plasmonic skyrmion SAM textures is that they exist on both sides of the metal/vacuum inter-face, but with topological character of the opposite sign. The SAM textures are defined by the surface Maxwell waves and the atomically sharp reversal in the sign of $\varepsilon$ across the interface. This is analogous to the formation of topologically protected surface states in gapped massive Dirac conduction and valence bands possessing the opposite effective electron mass. Specifically, because the circulating in-plane fields must be continuous across a metal/vacuum interface due to the boundary conditions imposed by free electron screening, the associated $S_z$~$\varepsilon(E^*\times E)_z$ component must be discontinuous and have the opposite sign on each side. The in-plane SAM, which is locked to the CCW circulating $k_{SPP}$-vector, however, remains parallel across the interface. Consequently, the SAM texture at the interface is composed of a pair of skyrmions on each side with the opposite $S_z$, and thus also, possessing the opposite topological charge. Because the $S_z$ is associated with an out-of-plane magnetic field, the plasmonic skyrmion can bifurcate transport of electrons into distinct spin polarized currents. Therefore, if a metal/dielectric interface consists of a conducting film with topologically trivial electronic bands overlaid on top of a metal surface separated by a thin insulating layer, the TRS breaking skyrmion pair in the plasmonic near field can impose the spin-polarized Hall effect for transport of electrons on either side on ultrafast time scale; electrons of the same spin in the dielectric and metal substrate would experience the opposite $S_z$, causing them to bifurcate, while electrons of the opposite spin would be deflected in the same direction. We note that the atomically confined skyrmion spin texture at quasi-2D metal/dielectric interfaces, is more tightly confined than for the in-plane skyrmion-anti-skyrmion pairing in magnetic materials.

Furthermore, we show that the SAM texture of the skyrmion pair within the primary ring ($r_1$) rotates by $2\pi$ with respect to the vortex core, forming a 3D SAM hedgehog texture, such as would be created by a magnetic monopole, if it existed, or a spin monopole in topological materials, and Bose-Einstein condensates. In element 902, we plot an interface-normal cross-section of the $S_n$ texture, where the color scale conveys the z-component of the local $S_n$ amplitude, and in elements 904 and 906, we show how the normalized SAM components change with r in the vacuum and metal sides. The spin vectors start from pointing directly up in vacuum at the vortex core, and continuously rotate towards the interface plane upon approaching $r_1$; on the metal side, the dielectric function together with the field circulation causes the spin to point from directly down into the metal at the vortex core and to rotate in-plane in the same direction as the vacuum spin at $r_1$. We note that this plasmonic SAM hedgehog is a topologically protected texture of a metal/dielectric interface, which is a real space analog of similar spin textures in the electronic band structures of gapped graphene and topological insulators, where the magnetic doping causes a massive Dirac gap opening and TRS breaking, and in Weyl semimetals where the creation of Weyl fermion in momentum space, i.e. Berry Curvature monopole, is realized by either TRS or inversion symmetry breaking. Unlike a macroscopic TRS breaking induced by a magnetic phase transition, in the case of plasmonic vortices, the TRS is broken on $\lambda_{SPP}$ length scale and the optical pulse time scale by the orbiting of SPP waves and their surface normal SAM, as will be elaborated further.

Finally, we briefly discuss the asymmetry of the spin texture across the metal/dielectric interface. The rate of rotation of $S_n$ from vertical to horizontal in the metal, compared with the rate on the dielectric side, is sharper near the core, as seen in elements 904 and 906, but becomes sharper near $r_1$ on the vacuum side. The different behavior in the two media is a consequence of contributions to SAM from the electric and magnetic field circulations [Equation 1] in the two media: $S_{z,n}$ from the in-plane electric field's circulation changes sign when the dielectric function passes through zero across the interface, but its contribution from the magnetic field's circulation, which is related to $\mu_0$ term in Equation 3c, remains the same because the permeability is continuous across the interface. Consequently, on the dielectric side, the electric and magnetic contributions add up so that $S_{z,n}$ does not vary substantially within $r_1$, while on the metal side, however, the electric and magnetic contributions to the total $S_{z,n}$ oppose each other causing a more rapid change.

A natural source of an electron vortex beam is a magnetic monopole SAM distribution. In practice, such beams have been generated in transmission electron microscopes using transmission phase plates, holographic phase structures, or magnetic nanostructure texturing methods. Therefore, a crucial implication of the hedgehog spin textures is that they act as sources of vortex electron beams that carry OAM. Because the skyrmion SAM texture discussed above is generated by the SOI of SPP wave packets that carry OAM, and their electromagnetic energy quanta and angular momenta are coherently transferred to photoemitted electrons that form the ITR-PEEM images, the observed photoelectrons carry the OAM as has been demonstrated in inelastic transfer of OAM from an SPP vortex to ~keV electron pulses in a transmission electron microscope. In the case of 2PP from plasmonic vortices, the photoelectron beam is emitted by a coherent field from surface area defined by the diameter of the vortex core ($\sim\lambda_{SPP}/2$), such that it acquires OAM with nearly 100% efficiency. The photoelectron vortex pulses propagate in ultrahigh vacuum with spatial profile defined by their Bessel function spatial distribution, which make their propagation self-healing and non-diffracting, making it attractive for quantum information encoding and transfer. We note that such propagating vortex electron pulses are also of interest for electron microscopy of magnetic materials, superconducting vortices, quantum communication, and quantum computing.

To validate the SAM skyrmion dynamic polarization and spatial distribution, we perform an ITR-PEEM experiment recording movies of the SPP field evolution by acquiring the nonlinear two-photon photoemission (2PP) signal in ~0.1 fs steps of pump-probe pulse delay. Upon the optical illumination of the circular coupling structure by circularly polarized light, SPPs are generated and propagate to form the plasmonic vortex at its center. The ITR-PEEM experiment records the vectorial SPP fields at the vortex that excite the 2PP signal, but does not directly capture the SAM, which is interpreted from the field's spatial and temporal evolution.

Figure 10:
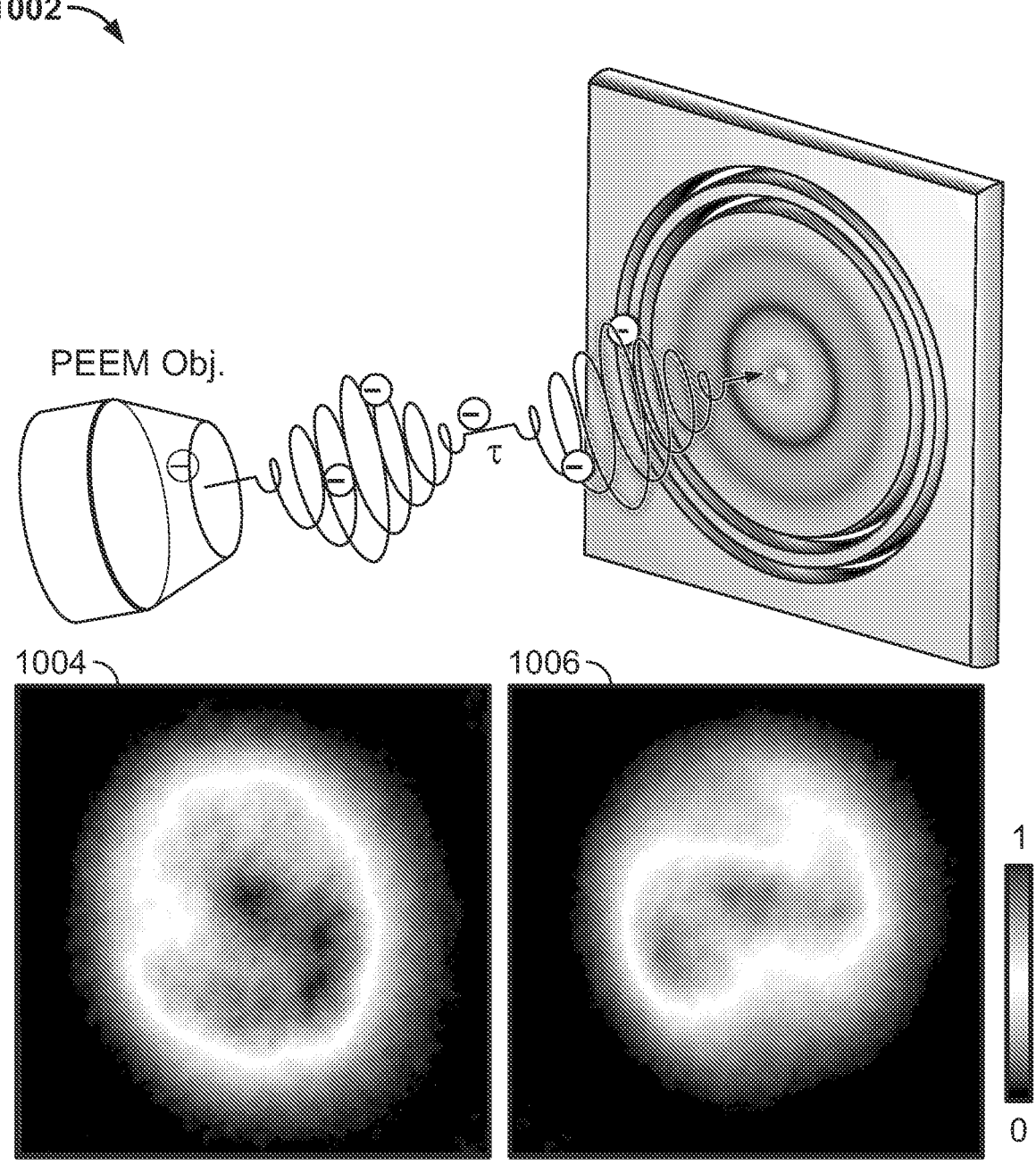
FIG. 10 is a diagram of an interferometric time resolved photoemission electron microscopy (ITR-PEEM) system and experimental results.

FIG. 10 is a diagram of an ITR-PEEM system and experimental results. Element 1002 shows a schematic of the ITR-PEEM experiment. Circularly polarized pump-probe pulse pairs incident through the PEEM electron objective (obj.) lens onto the sample (right square), to launch SPP waves depicted as concentric circular contrast. The intensified SPP field at the coupling structure center excites 2PP of electrons (spheres) that are collected and imaged by the PEEM electron optics. Elements 1004 and 1006 are single pulse PEEM images showing static distributions of the 2PP signal from an L=−1 (b) and L=+1 plasmonic vortices, respectively. The 2PP intensities are normalized to 1. The azimuthal PEEM image structure primarily arises from imperfections in the coupling structures. The lateral dimension of all experimental images is $2\lambda_{spp}$.

As shown schematically in element 1002, the sample is illuminated by a pair of identical phase-delayed pump and probe pulses (20 fs duration) that are incident and focused normal to the sample surface with circular polarization to launch SPP waves from the fabricated coupling structure. The SAM ($\sigma=\pm1$) of light generates SPP fields with OAM L=$\pm1$ that propagate towards the coupling structure center, where they form the respective vortices. The coupling structure is composed of 3-fold concentric rings with the innermost one having a radius of $5\lambda_{SPP}$. The coupling structure element radii increase by $\lambda_{SPP}$, so that the SPP fields that they individually generate add constructively, like from individual lines of a grating structure. Each slit is formed with a nominal ~100 nm width and depth by focused ion beam etching of a polycrystalline Ag film. The PEEM can record single pulse (delay $\tau$ independent) images of spatial distributions of the 2PP signal, as well as pump-probe pulse movies. Retardation plates set the excitation laser light polarization.

We image the SPP field evolution by advancing the delay $\tau$. The signal has a $\tau$ dependent contribution where the pump pulse generates the SPP field, and the probe pulse optical field interferes with its longitudinal component. Thus, by advancing $\tau$, the interference creates a 2PP signal component that is spatially modulated with the periodicity of the SPP field; this interference pattern spatially propagates at the local speed of SPP. The 2PP signal also has a contribution from the transverse $E_z$ component, which nominally does not contribute to the interference signal because it is orthogonal to the optical field. Advancing $\tau$, thus, obtains sub-optical wavelength resolution, $\tau$-dependent imaging of the interfering fields as the SPP component forms the vortex. The as-recorded, single pulse, time-integrated, photoemission images excited with the left and right circularly polarized light are shown in elements 1004 and 1006. Both PEEM images for the opposite helicity excitations show superficially similar circular distributions, i.e. within circular regions of $\sim\lambda_{SPP}$ diameter with the strongest 2PP signal coming from the center, where $E_z\rightarrow0$, and therefore, the signal must locally be defined by the in-plane fields. The admixture of the in-and out-of-plane field-induced 2PP signals, however, complicates the SAM skyrmion evaluation, because one cannot immediately decompose their contributions.

Figure 11:
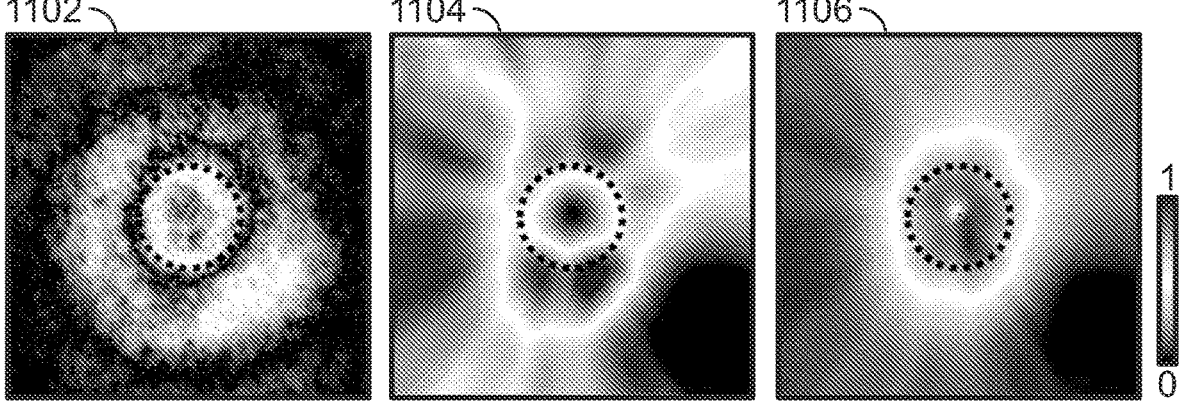
FIG. 11 is a diagram of ITR-PEEM experimental results.

FIG. 11 is a diagram of ITR-PEEM experimental results. Element 1102 shows an image of a $|E_r|$ component of the SPP vortex at $\tau\sim19.1$ fs extracted by inverse FT (IFT) of the $1\omega_L$ component of an ITR-PEEM imaging movie. Elements 1104 and 1106 shows images of the derived $|E_z|$ and $|E_\theta|$ components from element 1102. The color scales are normalized field strengths; the dashed circles indicate the vortex ring at $r_1$. The central dip in element 1106 is a consequence of a singularity in the radial differentiation rather than a real signal feature.

Figure 18:
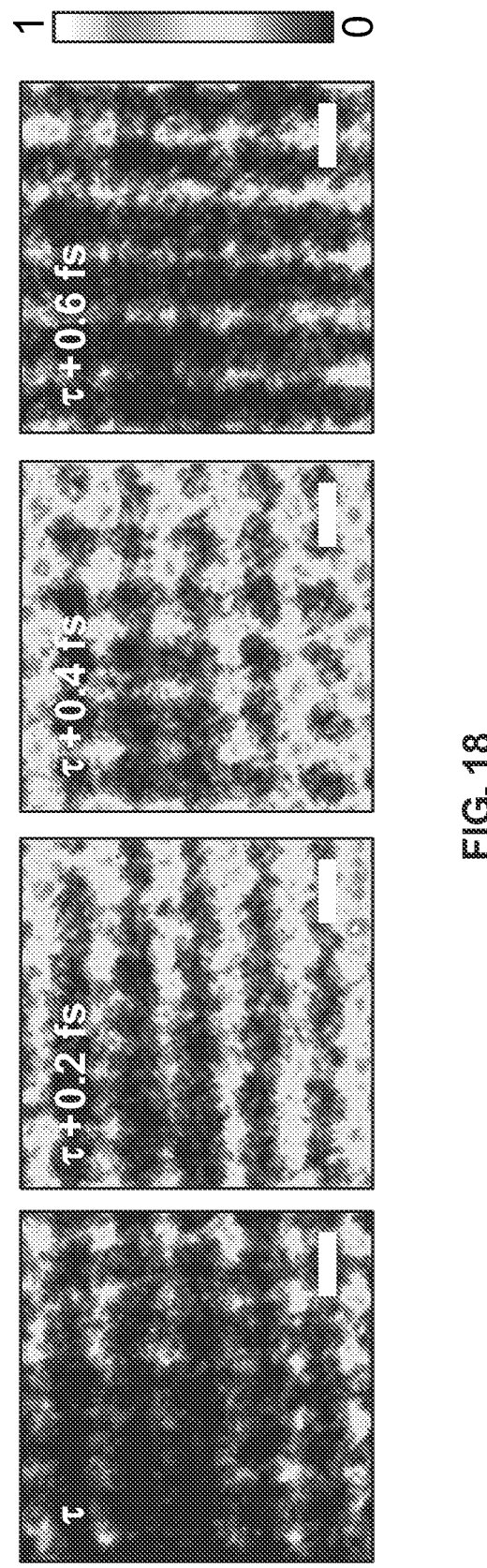
FIG. 18 is a diagram of ITR-PEEM image sequences.

To analyze the 2PP signals into its in-and out-of-plane SPP field components, we Fourier filter the data from the pump-probe ITR-PEEM experiments to selectively extract the space and time interfering signal as follows. The optical-SPP interference modulates ITR-PEEM movies (as shown in FIG. 18) at the integer multiples (n=0, 1, 2, . . . ) of the driving laser frequency, $n\omega_L$. We Fourier filter the movie, by first Fourier transforming (FT) it at each individual pixel element, and then select the $1\omega_L$ component, to perform an IFT. This procedure eliminates the signal from the $E_z$ and $E_\theta$ components of 2PP, because the interference only modulates $E_r$. Thus, element 1102 reports IFT images of $|E_r|$ at $\tau\sim19.1$ fs ($\tau=0$ fs defines the delay when the pump-and probe pulses overlap in time). A clear focus of the radial field appears within the vortex core, and a local minimum occurs at the vortex ring ($r_1$), as predicted by Equation 2b in our analytical model as shown in element 606 of FIG. 6.

Because Maxwell's equations define the vectorial space and time evolution of the SPP fields at the sample surface, it is sufficient to extract the experimental $|E_r|$ distribution and from that to derive the $|E_z|$ and $|E_\theta|$ components [103], as shown in elements 1104 and 1106. Such processing requires taking spatial radial derivatives, causing the derived images to be affected by noise along the $\hat{e}_r$ axis, giving rise to the diverging ray-like contrast in elements 1104 and 1106. This contrast, however, does not compromise evaluation of the radial vortex field distribution, because the major intensity regions, i.e. the primary vortex ring of $|E_z|$ and the slowly decaying $|E_\theta|$ in elements 1104 and 1106, agree with the corresponding analytical field distributions in elements 604 and 608 of FIG. 6. Also, the dashed circle in FIG. 11 marks the location of the vortex ring at $r_1 \approx 150$ nm, confirming that our raw and derived field distributions follow the predicted ones from Equations 2a-2c. We note that, because the Fourier filtered $E_r$ field and its derivatives $E_\theta$ and $E_z$ are in excellent agreement with numerical simulation on ~10 nm scale, our experiment achieves sub-diffraction limited imaging of SPP fields on the femtosecond time scale.

Figure 12:
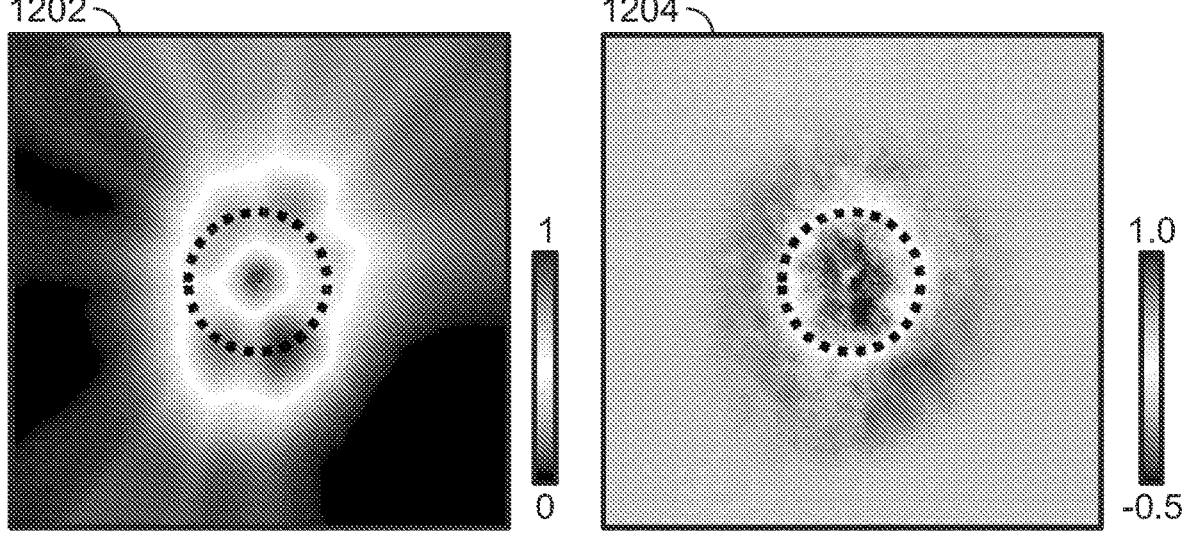
FIG. 12 is a diagram of components of plasmonic SAM.

FIG. 12 is a diagram of components of a plasmonic SAM. Elements 1202 and 1204 show the derived $S_r$ and $S_z$ components of the plasmonic SAM, respectively, based on the electric field distributions in FIG. 11. The dashed circles indicate the vortex ring at $r_1$.

Finally, the field distributions also define the SAM textures, which we determine based on Equations 2a-2c. Because the radial component of the SAM in Equation 2a follows $$J_1^2(k_{spp}r)/r,$$

and the $E_z$ field component follows $J_1(k_{spp}r)$, we can construct the radial component of SAM based on the experimental field component image in element 1104. The derived distribution of $S_r$ is shown in element 1202, from which it is evident that there exists a continuous change in the radial SAM. The strongest radial component is located near the vortex ring, as expected from element 706. The $S_z$ component can be obtained in a similar way, by using the field distributions in elements 1102 and 1106, because $E_r \sim J_0(k_{spp}r)+J_2(k_{spp}r)$ and $E_\theta \sim J_0(k_{spp}r)-J_2(k_{spp}r)$, so their product defines the distribution of $$S_Z \sim J_0^2(k_{spp}r) - J_2^2(k_{spp}r),$$

which is shown in element 1104. To avoid confusion, our approach does not directly image the SPP SAM, but our analytical model enables us to extract the fields and transform them into spin distributions based on their analytical Bessel functional form. Once $E_r$ field component is determined experimentally by IFT analysis of an ITR-PEEM movie, the other fields and SAM components directly follow from their Bessel function forms, according to the analytical model. It is clear that $S_z$ evolves continuously from its positive maximum at the vortex core to a negative domain surrounding outside the primary vortex field ring, and the maximum of $S_r$ coincides with the vortex field ring, in agreement with the analytical SAM distributions from the model in elements 704 and 706. Our approach is based on a single interferometric imaging of the plasmonic field and analytical modeling based on Maxwell's equations, which fully defines the time and space vectorial field and spin distributions.

Our study introduces a new quasiparticle, a twisted plasmonic SAM skyrmion. We have recoded and analyzed a nanofemto movie of the plasmonic nonlinear field distribution by microscopic imaging of the 2PP signal from a plasmonic vortex; from its analysis and modeling we deduce that a plasmonic SAM skyrmion spin texture is generated at its core. The skyrmion is created by illuminating a circular coupling structure with circularly polarized light carrying SAM of $\sigma=\pm1$ to impose OAM of $L=\pm1$. Analogous to magnetic skyrmions, the twisted SAM skyrmion texture for $L=-1$ vortex has its vacuum spin pointing up at the quasiparticle center, and continuously reorients through horizontal at the primary vortex ring to point down at its boundary. The quasiparticle boundary is defined by the second optical L-line singularity fringe from the vortex core, where the normalized spin discontinuously changes from down to up.

While we find a skyrmion texture of skyrmion number $N=1$ in the vacuum side for $L=-1$ vortex, our modeling shows that there is an additional skyrmion SAM texture on the plasmonic metal side with the opposite $N=-1$ charge; together the two SAM textures form a topologically protected entangled skyrmion pair, which forms a hedgehog SAM texture that breaks the local TRS within the primary vortex ring. The hedgehog texture is an electron analogue of a magnetic monopole field distribution, which acts as a coherent 2PP electron emission source, where the OAM of the SPP field is transferred to emitted electrons to form a free space electron vortex pulse. Such monopole electron vortex source is potentially interesting in electron beam imaging of magnetic materials, for quantum communication, information processing, and information transfer.

The analysis of plasmonic vortex and the accompanying skyrmion field distribution is an important conceptual advance because they are generated and evolve on the femtosecond time scale as defined by the optical excitation pulse. The coupling between the spin and orbital electromagnetic angular momenta can be applied to generate other topological excitations such as meron-like SAM textures, and their lattices that form through SPP interference. Therefore, they provide a fundamental platform for investigating the creation, annihilation, and interaction dynamics of topological fields in optics, and solid-state systems on the nanofemto scale. In addition, the reported plasmonic skyrmion is a dynamical quasiparticle formed by intense plasmonic fields concentrated on the $\lambda_{SPP}$ scale; it is stable within the lifetime of SPP wave packet, during which it can imprint its topological spin texture and orbital angular momentum on topologically trivial or nontrivial materials create free electron vortices, as well as achieve skyrmion number dependent chiral nano-object manipulations. It may also find applications in ultrafast sensing and in dynamical nonlinear materials with similar functions as fabricated metamaterials or flat optics. Furthermore, with stronger confinement in the lateral and vertical scales in multilayer metal-dielectric films, skyrmions may impose strong topological quasiparticle interactions creating and controlling SAM textures in quantum materials. The topological field and spin textures make plasmonic skyrmions ideal fields for provoking topological Floquet engineering to achieve TRS breaking, nonreciprocal, and axion physics in the condensed quantum matter.

Finally, our ITR-PEEM method for ultrafast imaging of surface plasmonic fields below the diffraction limit of light enables a deconstruction of ultrafast vectorial electric field and spin distributions based on analytical Maxwell's equation modeling. The application of topological fields at a trivial vacuum/silver interface allows to transiently break the TRS, and to initiate, as well as record emergent phenomena that are of interest, but not accessible to experiment, in high-energy field theory, but emerge in solid state materials on the nanofemto scale.

A Topological Lattice of Plasmonic Merons

Topology can originate intrinsically from the orbital symmetry, and elemental spin-orbit interaction, or intriguingly, be dressed by coherent vectorial optical fields interacting with trivial materials. Light can supply photonic spin-orbit interaction (SOI) to turn-on chiral chemistry or manipulate non-Abelian physics. Employing electromagnetic simulations and ultrafast, time-resolved photoemission electron microscopy we describe the geometric scattering of normally incident circularly polarized optical fields from a square coupling structure generating arrays of surface plasmon polariton vortices with orbital angular momentum. By electromagnetic simulation, we show SOI molding the plasmonic spin angular momentum texture within each vortex domain into a plasmonic magnetic meron-like spin texture arrays. We experimentally examine the dynamics of the meron lattice by resolving with deep subwavelength resolution and sub-optical cycle time accuracy their atomically precise periodic boundaries, by imaging their linear polarization L-line singularity distribution. We reveal how vectorial optical fields impress topological polarization arrays that break the time-reversal symmetry.

Topology is a singular topic in physics, which explores emergent properties of matter that are defined by geometry of internal and external interactions, and are impervious to continuous distortion of size and shape. Topological properties play defining roles in physical systems, ranging from high energy physics, where they are hardly accessible, to solid state physics, where they impart captivating emergent phenomena and serve as a bridge between the mesoscopic and microscopic, atomic, and even subatomic scales. Our curiosity lies in meron, which is a characteristic topological quasiparticle first discovered in magnetic materials; merons in ferromagnetic solids have stable vortex-like topological spin textures on the nanometer scale. They carry a stable quantized spin texture with half-integer topological charge, which has aroused interest in manipulating spin currents in magnetic materials and information storage for potential applications in non-volatile quantum memory devices and spin-based electronics.

Related topological spin or field textures have been discovered in Bose gases, liquid crystals, photonic crystals, and most recently, plasmonic vortices. Here we explore further how to extend the study of plasmonic merons from single localized to arrays of interacting delocalized excitation arrays. Because optics describes the physical structuring and interaction of vectorial electromagnetic fields, it is a natural domain for designing topological optical fields and exploring the phenomenology of their interaction with matter, especially on the nanofemto scale. Whereas meron textures in chiral magnets originate from the atomic spin-spin interactions, plasmonic merons have been generated by Poincaré engineering of two orthogonal polarization components that define the three-dimensional (3D) Stokes pseudospin vectors; these spin vectors can be created and controlled on the nanofemto scale define the matter dressing on a polarization Poincaré half-sphere. The plasmonic spin textures are generated by the angular momentum carried by an optical beam interacting with a plasmonic coupling structure with a defined geometrical charge, to define the spin-orbit interaction of surface plasmon polaritons (SPPs) through the quantum spin-Hall effect. Indeed, a variation of these defining parameters led to the discovery of plasmonic topological spin and field textures, with an integer topological charge, resembling magnetic skyrmion and skyrmion lattice textures by near-field optical methods and ultrafast nonlinear photoemission microscopy.

Through ultrafast interferometric time-resolved photoemission electron microscopic (ITR-PEEM) imaging and analytical theory, we have established that SPP vortices with defined optical angular momentum (OAM) undergo spin-orbit interaction of light (SOI) to form single meron or skyrmion spin textures. These topological spin textures are robust on ~20 fs time scale of the pulse duration and break the time reversal symmetry on nanometer scale; by near-field interaction with other materials, they can excite non-trivial topological states of matter. We report an ultrafast ITR-PEEM imaging of a lattice of topological plasmonic spin angular momentum (SAM) textures resembling a lattice of magnetic meron quasiparticles, which is designed by interference of SPP wave packets generated by nano-patterned square coupling structures. Its robustness over pulse duration is demonstrated by deep-subwavelength resolution imaging of linear polarization singularity distributions representing meron domain boundaries. The designed meron-like SAM lattice, which carries spatially and temporally distributed chirality, is primed for nanofemto interactions with broken space and time inversion symmetry.

Figure 13:
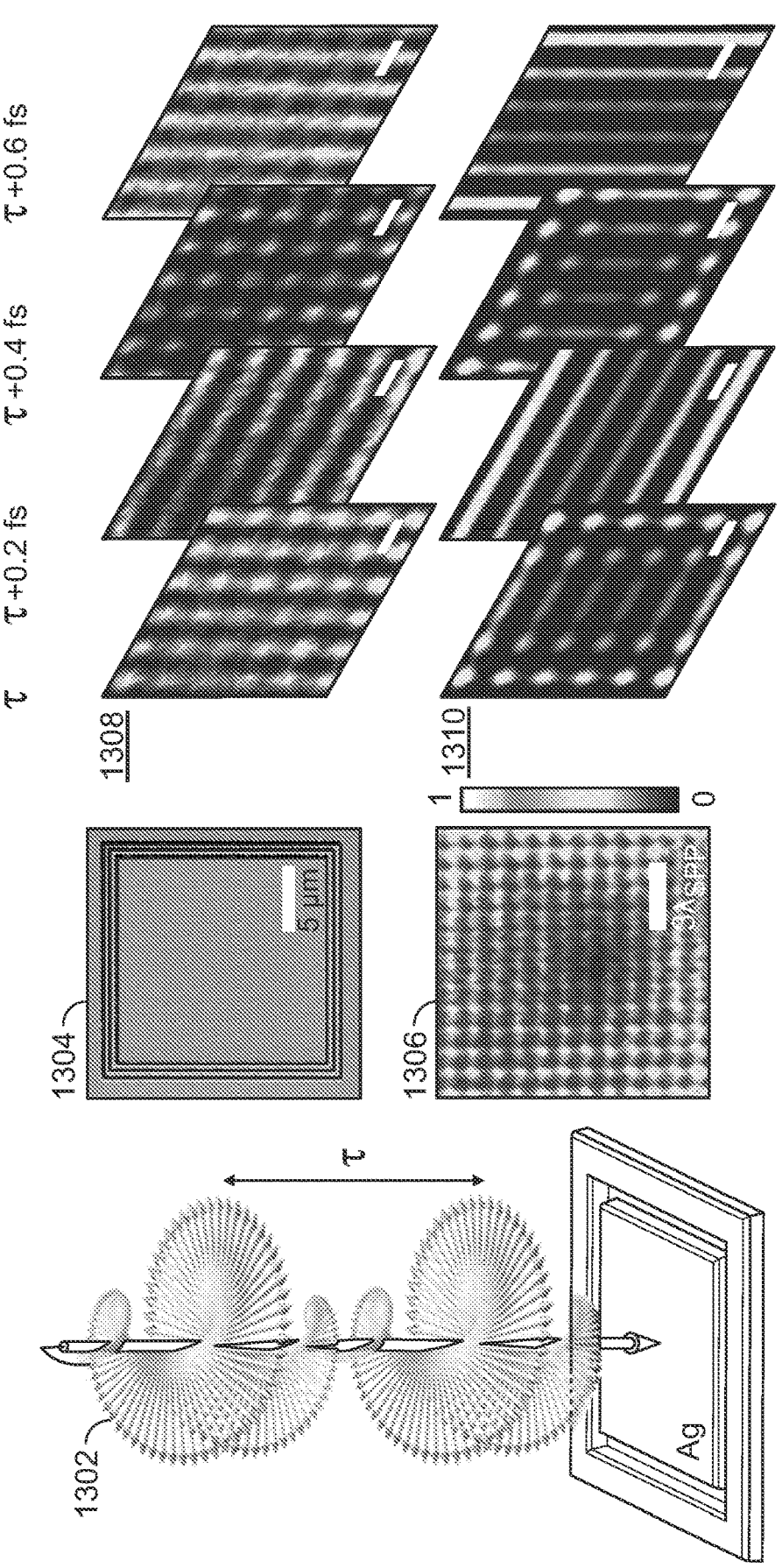
FIG. 13 is a diagram of ITR-PEEM imaging of a plasmonic vortex lattice.

FIG. 13 is a diagram of ITR-PEEM imaging of a plasmonic vortex lattice. Element 1302 shows a pair of identical, phase-locked circularly polarized fs pulses illuminate a silver film at normal incidence. The silver film has a lithographically inscribed square slit structure for generating the SPP fields. Element 1304 shows a scanning electron micrograph of the three-fold square slit coupling structure. Element 1306 shows a static PEEM image of the SPP interference field at the center of the coupling structure, under illumination by LCP light. Element 1308 shows snapshots of the spatial distribution of the 2PP signal excited by the total field when the pump excited SPP field interferes with the probe optical field; the PEEM images show how the 2PP signal evolves spatially in $\tau$=0.2 fs intervals due by interference of the SPP vortex, and the optical probe fields. Element 1310 shows FDTD simulated images showing the evolution of the interference between the in-plane components of the SPP and the optical probe electric field fields.

Element 1302 shows the ITR-PEEM experimental setup. Normally incident, circularly polarized light (CPL) pulses of 20 fs duration and $\lambda_L$=550 nm center wavelength illuminate a square SPP coupling structure. The coupling structure supplies the momentum to couple the optical field into SPP wave packets; it is nanofabricated by depositing 100 nm Ag film onto a n-type Si substrate by thermal evaporation method, and then etching a square shaped coupling structure by focused ion beam lithography. The coupling structure consists of three concentric square slits separated by the SPP wavelength ($\lambda_{SPP}$), such that the SPP fields scattered from each slit add in-phase. Element 1304 shows a scanning electron micrograph of the focused ion beam (FIB) fabricated structure, with the slit width and depth of nominal ~100 nm dimension, and each side of the inner most square structure having a dimension of $30\lambda_{SPP}$=15.9 μm, where $\lambda_{SPP}$=530 nm. The excitation wavelength is chosen because two-photon interaction imparts sufficient energy to excite nonlinear two-photon photoemission (2PP) measurements because its energy is sufficient to excite photoelectrons above the vacuum level through a nonlinear two-photon process; meanwhile, the contribution from the bulk plasmonic photoemission is minimal. Moreover, at this wavelength, the SPP polarization dephasing is sufficiently slow for the SPP wave packets to propagate beyond the coupling structure diameter.

The excitation by a left circularly polarized (LCP) single pulse train in element 1306 records a spatially modulated static image at the center of the coupling structure, which is composed of interferences between field components among the optical excitation light and the SPP wave packet it creates. The period of this self-interference is $\lambda_{SPP}$ near the slit and $\lambda_{SPP}/2$ at the square center where the oppositely propagating SPP fields meet. In the case of ITR-PEEM measurements, a pair of identical pump-probe pulses with pulse delay $\tau$ excites the sample The pump-probe excitation introduces a delay dependent signal, which captures the interference component between the SPP wave packet generated by the pump pulse and the optical field of the delayed probe pulse. Consequently, ITR-PEEM records a vectorial SPP flow in the sample. Scanning $\tau$ in <100 as steps and imaging the generated 2PP signal produces a sequence of PEEM images such as in element 1308. These images starting from $\tau$=36.2 fs ($\tau$=0 fs is defined by the temporal overlap of the pump and probe pulses), shows how advancing the delay in 0.2 fs temporal increments modifies the pump SPP and probe optical interference. This image sequence is processes by Fourier filtering of the raw ITR-PEEM data (shown in FIG. 18) by pixel-wise fashion and performing inverse Fourier transform of the linear, $1\omega_L$, component, where $\omega_L$ is frequency of the driving laser. This procedure eliminates $0\omega_L$ signals that arise from the self-interference between the optical field and its SPP wave packet, or are incoherent because the SPP dephasing generates hot electrons, as well as nonlinear $2\omega_L$ and higher signals. The extracted $1\omega_L$ images in element 1308 represents the delay dependent first-order optical-SPP interaction consisting of interference between probe field and the in-plane component of the pump-induced SPP field. FIG. 18 presents the full data of the $1\omega_L$ component of the SPP field evolution.

The experimental Fourier filtered images in element 1308 show SPP interference patterns forming horizontal to vertical one-dimensional (1D) stripe photoemission patterns with $\lambda_{SPP}$ periodicity, along with intermediate two-dimensional (2D) square lattices arrays of discrete spots of constructive interferences that locate of the plasmonic vortices where the 1D stripes intersect. The evolution of these images follows the gyration of the SPP vortex array, which interferes with the circulating probe field in a rotating frame. We employ the finite difference time domain (FDTD) method to show in FIG. 19 the calculated in-plane SPP field distributions excited from the square lattice by LCP light. The fields transition between the 1D stripe and 2D lattice patterns through gyration of SPP fields about the vortex cores. For the interference patterns to have transition from the lattice to stripe images, the gyration of the neighboring vortices must alternate from clockwise (CW) to counterclockwise (CCW). Element 1310 shows the calculated pump excited SPP and the probe pulse optical field interference for LCP excitation that defines the ITR-PEEM imaging as their mutual delay is advanced by half-optical cycle; this simulation reproduces ITR-PEEM image contrast in element 1308, and thus confirms its origin.

The appearance of the vertical and horizontal lines in elements 1308 and 1310 is a graphical reminder that the CPL light can be decomposed into linearly polarized fields with a $\pm\pi/2$ phase shift. These 1D images appear when the pump-probe delay is such that it interferes constructively with either the vertical or horizontal component of the SPP field, and destructively with the other. It suggests that the CPL excitation could be conducted with linearly polarized light with the appropriate phase control.

Figure 14:
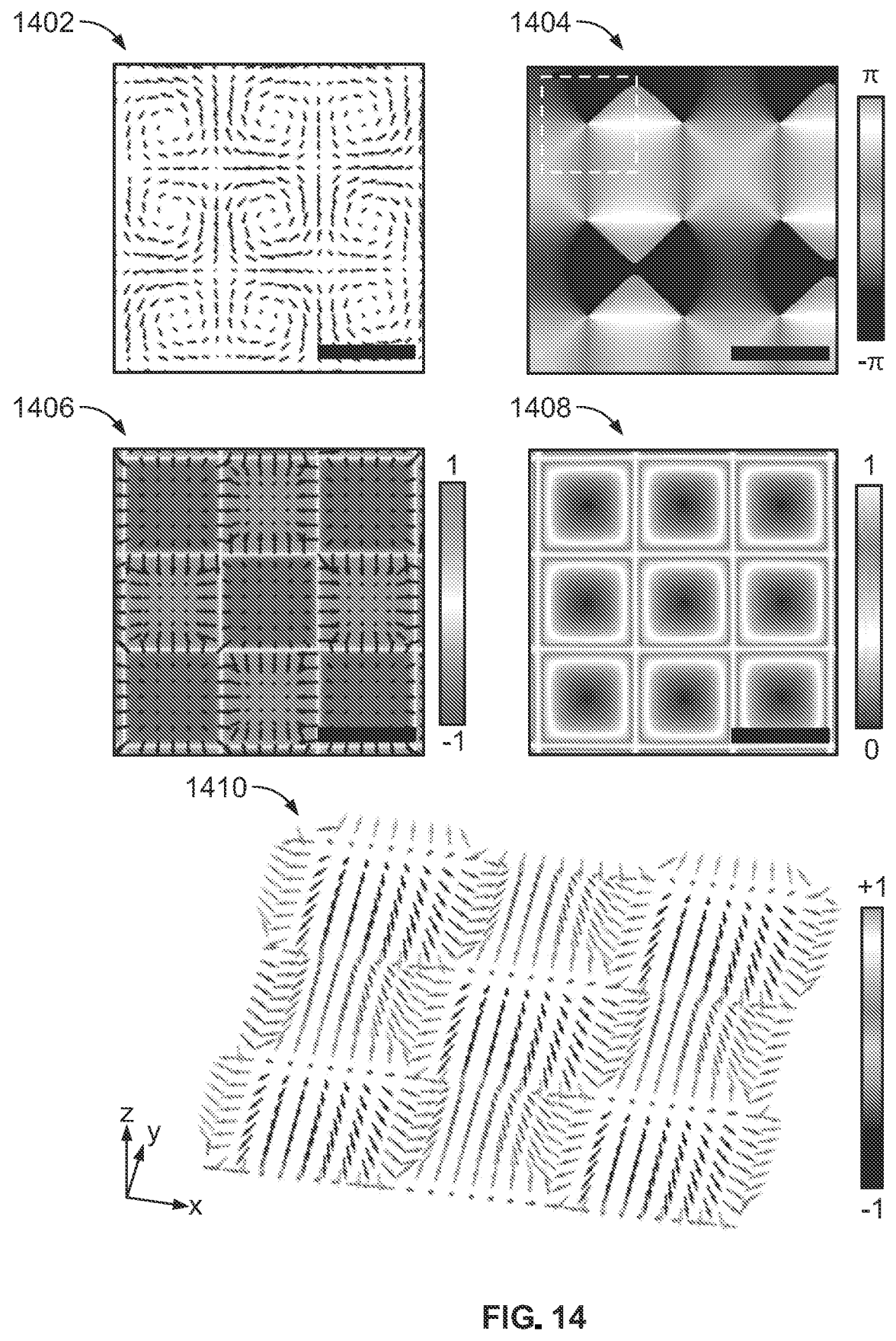

FIG. 14 is a diagram of a lattice of meron-like SAM textures. Element 1402 shows a Poynting vector distribution of the plasmonic vortex lattice when excited by LCP light, showing the alternating SPP gyration in the horizontal and vertical directions. Element 1404 shows phase angle distribution of $E_z$ field, with color scale showing its variation from $-\pi$ to $\pi$ radians. The white square marks the region of the vortex flow in the top-left SPP vortex in element 1402. Element 1406 shows a colormap showing the magnitude of the normalized out-of-plane component of the plasmonic SAM, and the arrows show the direction and magnitude of the normalized in-plane SAM. Element 1408 shows the magnitude of the normalized in-plane SAM. Element 1410 shows a 3D representation of the meron-like SAM lattice. The color scale indicates the magnitude of the out-of-plane SAM. All images correspond to the same region in FDTD simulation. The scale bars represent $\lambda_{SPP}/2$.

To further interpret how the LCP light carrying longitudinal spin angular momentum (SAM) of $\sigma=\pm1$ generates the observed contrast, we consider the generation of SPP wave packets carrying OAM, and how they undergo SOI and interference to produce a square array of vortices. To proceed, we simulate the SPP Poynting vector ($k_{SPP}$) distribution that describes the SPP energy flow under LCP excitation, which is shown by arrows in element 1402 for a central cluster of nine vortices. The vector $k_{SPP}$ distribution reveals the SPP energy flows around the neighboring vortex cores alternating in horizontal and vertical directions between the CW and CCW circulations. Such alternating vortices are consistent with the field gyration in FIG. 19. In element 1404, we show the phase map of the out-of-plane SPP electric field ($E_z$) in the same region as in element 1402 at a time when the SPP field reaches the maximum at the center of the square, to define the phase and spatial dispositions of the vortex lattice for the square coupling structure. Evidently, the phase for vortices lying on the positive diagonal squares circulates in the CCW direction and for the negative diagonal ones in the CW direction. Within each vortex, the phase winds by $2\pi$, which results in a phase singularity extending between two vertical vortex cores, and after advancing by $\pi/2$ between the horizontal ones; this explains the vertical and horizontal 1D contrast in elements 1308 and 1310. Hence, we can assert that the generated SPP wave packets form lattice of plasmonic vortices each having a defined OAM of $\pm1$.

Evanescent waves such as SPPs propagate in direction of their $k_{SPP}$ wave vectors, and their electric fields that oscillate between the transverse and longitudinal polarizations in the meridional plane. This oscillation causes transverse locking of the SAM pseudovector, which is described by $$S = \frac{1}{4\omega}\text{Im}(\varepsilon E^* \times E + \mu H^* \times H),$$

where E and H are the electric and is described by magnetic field components of the SPP wave, and $\varepsilon$ and $\mu$ are the permittivity and permeability of the supporting materials. This spin-momentum locking is a chiral property of the evanescent waves, that is referred to as the quantum spin-Hall effect of light.

Element 1406 shows a colormap of the out-of-plane SAM component normalized to its magnitude at the vortex core, along with their normalized in-plane components (arrows) for the same instantaneous time and region as in element 1404. In addition, the magnitude of the normalized in-plane SAM is shown in element 1408, demonstrating a sharp square distribution that forms a boundary between the converging/diverging in-plane SAM pseudovectors in element 1406. For right circularly polarized (RCP) incident light, the incident photon spin is reversed, and consequently, the calculated SAM components in each square domain are simply reversed (and therefore are not shown). Moreover, element 1410 plots a 3D representation of the normalized SAM textures within the same central lattice regions in element 1404, which depicts more graphically the vectorial spin textures associated with the lattice of SPP vortices generated by LCP excitation. Such SAM texture originates from the SOI of the SPP field, which causes formation of the alternating $k_{SPP}$ circulation of the vortices. The out-of-plane and in-plane SAM directions are a consequence of spin-momentum locking and sign of the field circulation. Furthermore, the SAM textures are most symmetrically defined in the central domains, but as amplitudes of the interfering fields with the opposite $k_{SPP}$ becomes unbalanced, the symmetry lessens further from the central domains.

To evaluate the SAM textures quantitatively, the SPP fields are subdivided into regions where at the center the SAM points into or out-of the surface plane, corresponding to the North or South poles of a Poincaré polarization sphere, and at their boundaries between them the SAM lies in the surface plane, corresponding to the Poincaré sphere equators. In addition, we observe repeating square shaped domains that tile element 1408 with edges defined by lines of the maximum value of the in-plane SAM. This implies the square domains are bounded by deep subwavelength scale edges where the spin angular momentum lies purely in the x-y plane and gradually angles orthogonal to it (+/−z) at the vortex core centers. These SAM textures are reminiscent of the ones previously discovered in the magnetic and plasmonic merons, and therefore we refer to them as meron spin textures forming a periodic lattice with a $\lambda_{SPP}$ periodicity. These SAM textures form stable domains over the excitation pulse duration time scale, as we will show. According to the Faraday's law, these circulating SPP fields generate a surface normal magnetic field at the vortex cores, which break the time-reversal symmetry with the sign alternating with $\lambda_{SPP}/2$ periodicity that causes SAM to point up or down for the CW/CCW circulations, respectively.

Figure 15:
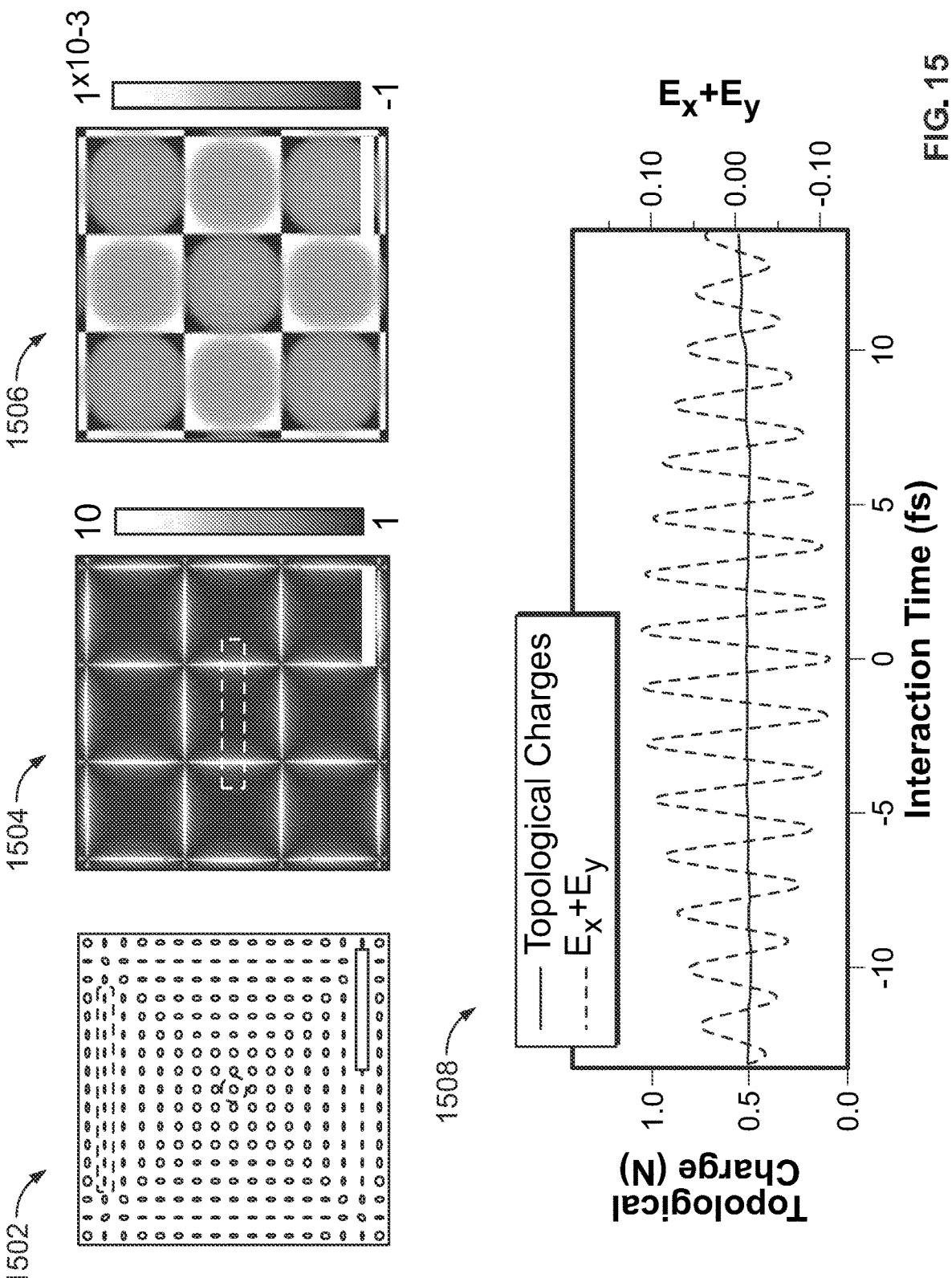
FIG. 15 is a diagram of topological properties of meron SAM.

FIG. 15 is a diagram of topological properties of meron SAM. Element 1502 shows polarization ellipses of the in-plane electric field of the SPP lattice. The circular C-points and linear L-Line polarization singularities of $E_{SPP}(x, y)$ generate the out-of-plane SAM (at the center) and in-plane SAM (at the boundary), respectively. The lines shown within the dashed rectangles indicate a segment of L-lines that define the boundary of a topological domain. The point indicated by the dashed circle at center of the domain represents a C-point, where the $S_z$ is maximum. The scale bars indicate $\lambda_{SPP}/4$. Element 1504 shows the calculated L-line polarization singularity distribution. The colorscale represents the polarization ellipticity ranging from the circular (+1) to nearly linear (10). Element 1506 shows the distribution of the quasiparticle density shown for the same region as in element 1504. Scale bars in elements 1504 and 1506 indicate $\lambda_{SPP}/2$. Element 1508 shows a topological charge per domain of ½ for nine effective meron domains at the coupling structure center (details shown in FIG. 20), and the amplitude of the in-plane $E_x+E_y$ SPP fields at the C-point of the central domain as a function of the interaction time.

Considering the field and spin textures in more detail, we focus on the periodic boundaries of the meron-like spin textures that appears as white contrast in element 1406, which is naturally linked to the polarization singularities of the SPP field. Element 1502 shows a map of the in-plane SPP electric field $[E_{SPP}(x, y)]$ polarization ellipses for the bottom left square domain in element 1406. The map is obtained by drawing the orbit that the electric field vector traces at each point in space during one cycle of the vortex gyration. Two characteristics stand out: (1) all points where the polarization becomes linear lie on a closed curve tracing the boundary of each domain (dashed rectangles); (2) the isolated points of circular polarization exist at the center of each domain (dashed circles), and at corners of each domain where the linearly vertically and horizontally polarized edges meet. In vectorial optics, these limiting polarizations are referred to as the L-line and C-point singularities, respectively. Element 1504 shows the polarization ellipticity distribution of the in-plane SPP field, where large values immediately reveal the L-line distribution. The singular point mapping is a crucial property of the SAM topology that locates the geographic points of the polarization Poincaré sphere; specifically, the L-lines define its equator, where its out-of-plane (z) component passes through zero, and the C-point, its North and South poles. Above, we surmised that the square domains are defined by boundaries where the SAM vectors lie in-plane. We confirm this by identifying L-lines as boundaries of the topological spin textures as defined by the Poincaré sphere.

To quantitatively establish the meron topology within each square shaped domain, we evaluate the quasiparticle topological density based on their SAM orientations. The topological quasiparticle density is defined as $$D = n \cdot \left(\frac{\partial n}{\partial x} \times \frac{\partial n}{\partial y}\right),$$

where n is the unit vector that defines the direction of the order parameter and D quantifies its curvature. Whereas for magnetic topological quasiparticles the vector $$n = \frac{M}{|M|}$$

is defined by normalizing the local magnetization M, by analogy, for plasmonic spin textures, we use the normalized SAM as the order parameter, $$n = S' = \frac{S}{|S|}.$$

Figure 19:
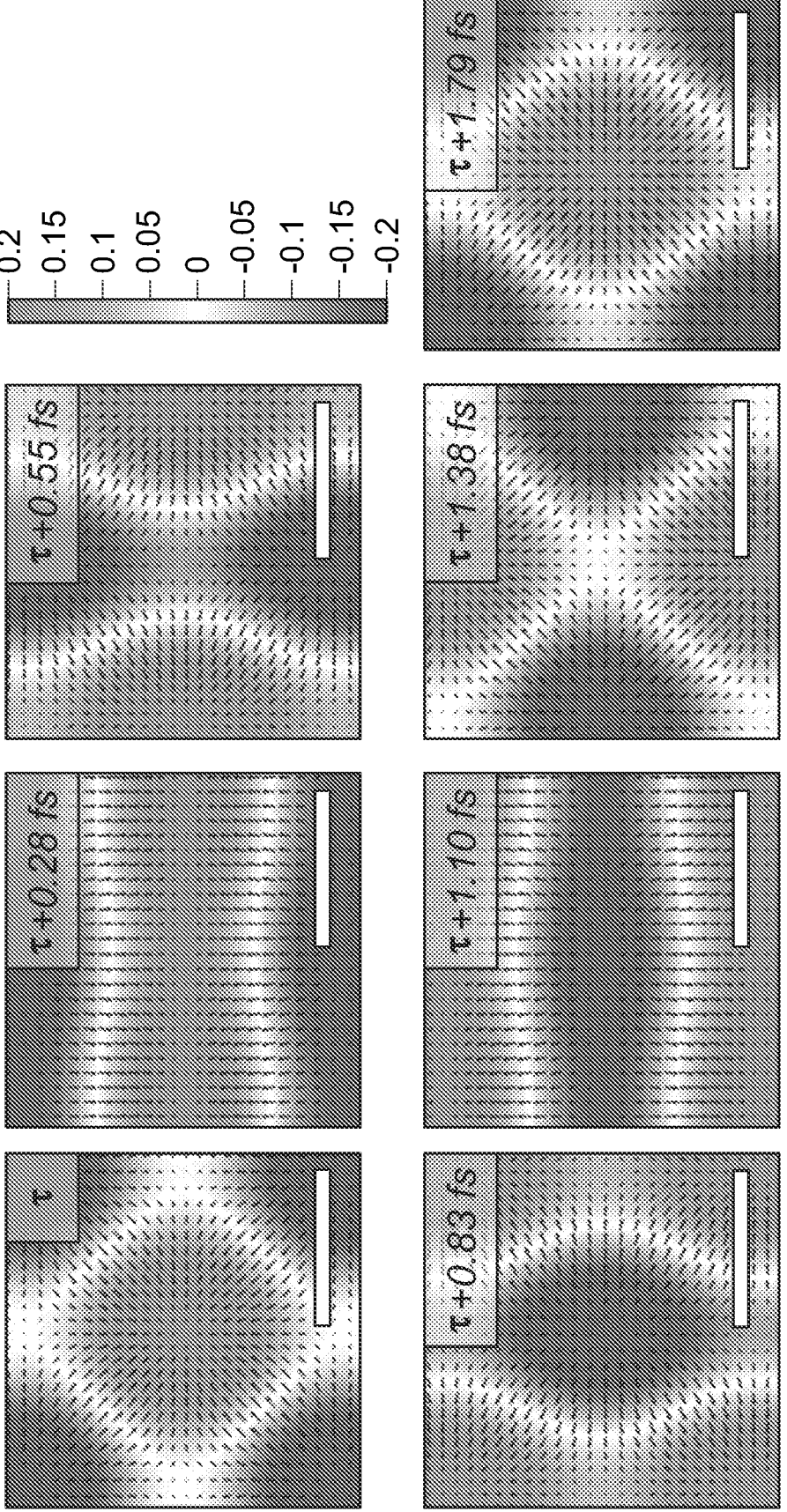
FIG. 19 is a diagram of pure SPP electric fields for square lattice from finite difference time domain (FDTD) simulation.

Element 1506 shows the calculated distribution of D at an instantaneous time where the SPP wave packet reaches maximum amplitude value at the center of the coupling structure. FIG. 19 presents the femtosecond time evolution of D. Whereas D evolves spatiotemporally as the SPP lattice is established and dissolves, it is stable over the ~20 fs duration of the excitation pulse. By performing areal integrals $$N = \frac{1}{4\pi} \int \int D \, dx \, dy$$

over nine effective square domains (see FIG. 20), we obtain the average topological number (N) to be 0.5. The half-integer value of N within each square domain confirms that the plasmonic topological textures belong to meron quasi-particles. Finally, in element 1508 we plot N as a function of interaction time with time zero defined by when SPP wave packet reaches maximum amplitude value at the square center, showing that N remains constant the over the duration of the SPP wave packet, confirming the topological spin texture is robust and can transiently break the time reversal symmetry to induce chiral and non-trivial topological phenomena.

Direct verification of the plasmonic meron spin texture requires quantification of the spatiotemporal evolution of the SPP fields and their spin textures with sub-wavelength spatial resolution. The ITR-PEEM, however, records charge and not the spin nanofemto dynamics. Therefore, to extract the spin information indirectly we analyze the field flow through the numerical Horn-Schunk (HS) algorithm, an artificial intelligence approach to moving image analysis. This method identifies the linear polarization regions of the SPP fields measured from the optical image propagation velocity vectors to thereby validate formation of the SPP spin texture based on the gradient intensity in image sequences measured by PEEM. The HS algorithm minimizes a global energy functional $F_{HS} = \int \int (I_x v_x + I_y v_y + I_t) dx dy$, where $I_{x,y,t}$ are pixel-wise spatial and temporal derivatives of image intensity, and $v_{x,y}$ are the optical flow velocity vectors of the evolving photoelectron signal. Specifically, the intensity I refers to the photoemission signal from the sequence of $1\omega_L$ Fourier filtered PEEM images (element 1308 and FIG. 18), normalized to span the range between 0 and 1, which correlate to the degree of linear polarization of SPP fields. Thus, HS algorithm outputs a sequence of velocity distributions $(v_x, v_y)$ to extract the degree of linear polarization of SPP fields from the Fourier filtered PEEM data, and thereby, the optical flow. The regions of high optical flow velocities identify the regions of the linear polarization of SPP fields and hence, the HS method extracts experimental L-line maps from the dynamical nanofemto imaging of the SPP fields with a sub-diffraction limited resolution.

Figure 16:
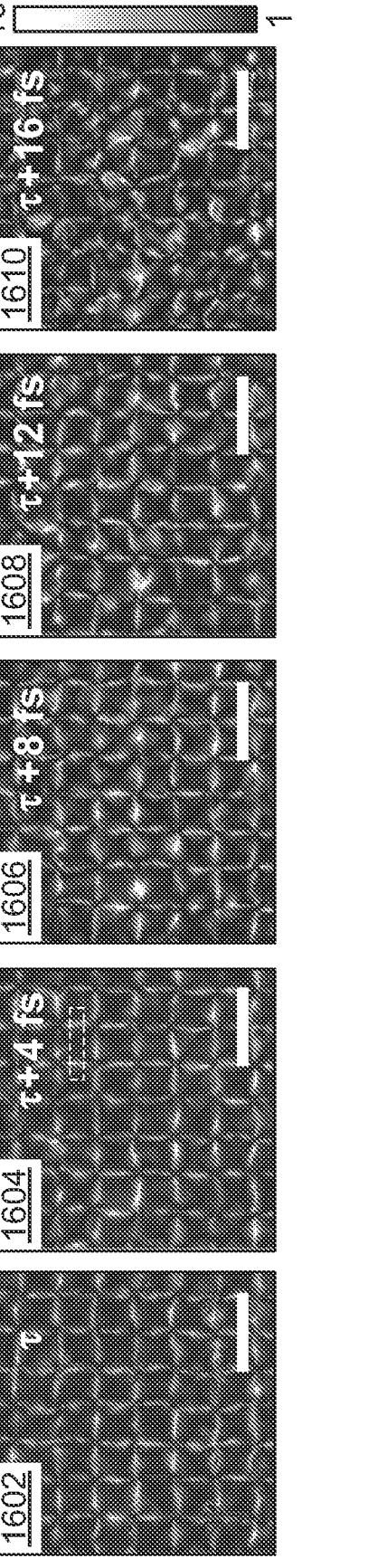
FIG. 16 is a diagram of ITR-PEEM images of L-line evolution of a plasmonic vortex lattice.

FIG. 16 is a diagram of ITR-PEEM images of L-line Evolution of a plasmonic vortex lattice. Elements 1602, 1604, 1606, 1608, and 1610 show experimentally extracted L-line distributions of the linearly polarized SPP fields obtained by the HS method, over 16 fs time window after the meron lattice is established. The white scale bar in each image indicates $\lambda_{SPP}$ and the color-scale represents the polarization ellipticity from the circular (+1) to nearly linear (10) polarization. FIG. 16 reveals the robustness of square shaped domains that define the SAM texture forming a lattice with a period of $\lambda_{SPP}/2$ over pulse duration, and the ability to extract sub-diffraction limited information on plasmonic spin textures by ITR-PEEM.

FIG. 16 reveals the time evolution of thus defined L-line distributions obtained from experimental ITR-PEEM movies over a span of 16 fs, where each optical cycle has time period of ~1.83 fs. It confirms the formation of a lattice consisting of square shaped domains, each having a dimension of ~$\lambda_{SPP}/2$ notably, this lattice is stable over >16 fs time scale. At the boundary of each square domain the L-line value is maximum signifying the most rapid flow of the linearly polarized SPP fields between the meron domains, where the in-plane SAM defines the meron boundaries. The excellent agreement between the experimentally extracted L-lines and the simulated ones in element 1504, confirms the formation of a lattice of plasmonic meron spin textures.

Figure 17:
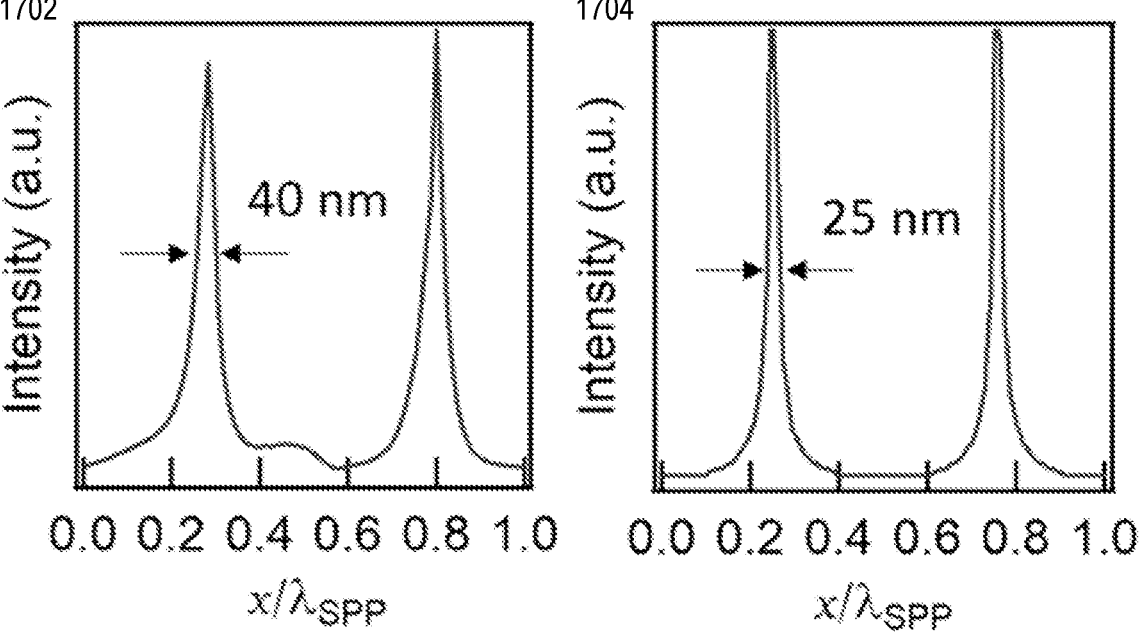
FIG. 17 is a diagram of deep subwavelength L-line profiles.

FIG. 17 is a diagram of deep subwavelength L-line profiles. Element 1702 shows an ellipticity (L-Line) profile extracted from the region enclosed by the white rectangle in element 1604, with a full width at half-maximum (FWHM) ~40 nm. Element 1704 shows a simulated ellipticity (L-Line) profile taken from element 1504, showing a FWHM ~25 nm. While L-line is expected to occur on <1 nm scale, the FWHM of the simulated ellipticity is limited by the resolution used in FDTD simulation (10 nm).

Finally, we emphasize that because the L-line singularity is the boundary across which $S_z$ flips, it can be considered as a superposition state of the left and right circularly polarized SPP fields that exists on an atomic or even smaller spatial scale. In other words, it is a cat state where the SPP fields could perform quantum computation operations. In FIG. 17, we show horizontal line profiles of the experimental and calculated L-lines integrated over rectangular regions indicated in element 1604 and element 1504, respectively. While the L-lines occur at singular points, its measure, i.e. the polarization ellipticity, has a finite width defined by finite the resolution used in FDTD simulations. The L-line resolution, therefore, is defined by the full width at half-maximum (FWHM) of the ellipticity peak, which is ~30 nm on average. For the experimentally extracted L-lines, the average FWHM of the ellipticity is ~40 nm for L-lines averaged over 7 by 7 domains, close to that obtained from the simulation. Therefore, we demonstrate the imaging of such polarization singularities on both deep subwavelength scale, and sub-optical cycle time scale that does not involve division by zero.

By electromagnetic simulations and ultrafast microscopy, we demonstrate the design of a lattice of meron-like plasmonic topological spin textures, based on the optical field polarization and SPP coupling structure geometry. Whereas the previously employed circular or Archimedean spiral coupling structures can define the geometrical charge that defines the properties of single plasmonic topological skyrmion and meron textures through the SOI of SPPs, polygonal SPP coupling structures combined with CPL optical excitation can generate a lattice of SPP vortices, which excite a lattice of meron-like topological spin textures. Specifically, SPP launched from square slit structures by CPL form square domains consisting of alternating merons in the vertical and horizontal directions with spins pointing up and down at the vortex core, with topological charge of +½ and −½, respectively. In addition, unlike topological textures composed of plasmonic fields, which average to zero over one optical cycle, the reported plasmonic meron SAM textures are stable over a time scale of the optical excitation pulse, which we confirm in FIG. 16 to be over 16 optical cycles.

The ITR-PEEM imaging demonstrates that it is possible to image the complex spatial polarization distributions on a deep subwavelength scale by recording the delay dependent photoelectron distributions in ITR-PEEM movies. Besides showing the advantage of using massive photoelectron particles to image photon fields, this also suggests that it might be possible to achieve deep sub-wavelength resolution in lithographic processes with visible light, if one can take advantage of polarization sensitivity of light-matter interaction.

The generation of plasmonic vortices by vectorial optical fields, and geometric coupling structures offers a rich platform for the design of plasmonic vortex arrays with topological SAM textures and their interactions on the nanofemto scale. Such fields transiently break the time reversal symmetry in the near field, and can be applied to drive charge and spin currents, dynamical studies of topological phase transitions, to excite Majorana modes in chiral superconductors, as nodes for quantum information processing, interaction with molecular materials through dipolar coupling, or through non-linear photoemission process generate electrons carrying topological charge in form of orbital angular momentum. Finally, in the investigated excitation scheme, we employ plane wave excitation, but one can envisage how the optical field for the SPP excitation could be spatially and temporally modulated to control designed polarization fields that define the plasmonic SAM textures. For example, considering CPL light as a linear superposition of vertically and horizontally linearly polarized optical fields interacting with the vertical and horizontal edges of the square coupling structure, it should be possible to switch between the LCP and RCP excitation by varying the delay between the two linear components by a $\pi$ phase shift, and thereby switch the topological charge on each meron domain on a sub optical cycle time scale. Such excitation could individually address the topological spin textures of specific domains for the purpose of multiple quantum-bit operations. Our research discloses crucial features of plasmonic meron topology, which can unveil new realizations regarding surface plasmon field properties and dynamics.

ITR-PEEM is a highly parallel and non-perturbative ultrafast microscopy method for capturing sub-diffraction limited vectorial space-time SPP fields. It is based on recording spatiotemporal distributions of photoelectrons excited by the total electric field at the surface via 2PP process, such that the 2PP signal from the sample is proportional to the integral $$\int E_T^4(x, y, z, t)dt$$

of the total field where $E_T(x, y, z, t)=E_L(x, y, z, t)+E_{SPP}(x, y, z, t)$, and $E_L$ denotes the incident optical field and $E_{SPP}$ the SPP field it creates. When the excitation is performed with identical pump and probe pulses with interferometrically defined time (phase) delay $\tau$, the photoemission signal has contributions where 2PP is excited by the two pulses acting independently, which is independent of the delay $\tau$, and cross terms capturing the interference between the pump excited SPP and the optical fields that varies with $\tau$.

Specifically, we image the SPP field dynamics with a SPECS aberration corrected low energy electron microscopy/photoemission electron microscopy (AC-LEEM/PEEM) with specified spatial resolution about 8 nm. We operate the instrument in the PEEM mode. The 2PP signal is excited by illumination of the sample with <20 fs laser pulses generated by a non-collinear optical parametric amplifier (NOPA) that is pumped by the third harmonic of an IMPULSE Clark-MXR Yb-doped fiber oscillator/amplifier system operating at a 1 MHz repetition rate. The NOPA produces excitation pulses at $\lambda_L=550$ nm (2.25 eV), which, together with the SPP field they generate, excite photoelectrons by non-linear 2PP process. The excitation light is transmitted through a Mach-Zehnder interferometer (MZI), to generate identical pulses with the delay advanced in 100 as steps under interferometric control. The excitation field polarization is established by passing the linearly polarized NOPA output through a $\lambda/4$ retardation plate. The optical pulse duration is optimized by reflection from negative dispersion mirrors.

We simulate the nanofemto evolution of the vectorial SPP fields by the full-vectorial finite-difference time-domain (FDTD) method that uses the constitutive relations to evolve electromagnetic fields by solving the Maxwell's equations at each point in space. We perform the FDTD simulations for the vacuum/Ag interface with a square coupling structure composed of $30\lambda_{SPP}$ long slits joining orthogonally together, which is illuminated by normally incident CPL pulses matching the ITR-PEEM experimental conditions. For $\lambda_L=550$ nm, the dielectric function of silver is described by a Drude relative permittivity, as implemented in the Lumerical FDTD software based on fitting experimental dielectric functions. It gives the corresponding SPP wavelength of $\lambda_{SPP}=530$ nm.

FIG. 18 shows a diagram of ITR-PEEM image sequences. Element 1802 shows raw ITR-PEEM images as delay times are advanced by 0.2 fs in two-pulse excitation. The scale bars represent $\lambda_{SPP}$.

Employing phase-locked identical pump-probe excitation, ITR-PEEM allows time dependent dynamical imaging of SPP flow in the sample. FIG. 18 shows snapshots of the raw data measured by ITR-PEEM, starting at $\tau=36.2$ fs after the maximum of two-pulse autocorrelation, with the pump-probe delay advanced by 0.2 fs. This raw data represents delay time dependent photoemission yield from a measurement with coherent non-linear absorption of two quanta of light ($\hbar\omega_L$); therefore, each pixel of raw data can be analyzed into different harmonics ($0\omega_L$, $1\omega_L$, $2\omega_L$ and so on). As can be seen from the snapshots, the interference patterns in raw data is accompanied with static photoemission background, because it contains all the harmonics and is dominated by the static $0\omega_L$ component. Hence, by pixel-wise Fourier transforming of the raw ITR-PEEM movie, and subsequently apply a square filter to the resulted frequency resolved photoemission signal, we extract the $1\omega_L$ component which contains the information of delay dependent first order light-plasmon interaction; interaction between the component of the incident probe field parallel to the sample surface and in-plane SPP fields created by pulse. We finally perform pixel-wise inverse Fourier transformation of the filtered data to obtain the movie of real space SPP evolution presented in the FIG. 13, FIG. 18, and FIG. 19.

FIG. 19 is a diagram of pure SPP electric fields for square lattice from FDTD simulation. Element 1902 shows simulated in-plane pure SPP electric fields distributions excited from the square lattice by LCP light shown over one optical cycle. The colormap shows the out-of-plane component of the SPP electric field, and the arrows represent direction of the in-plane SPP electric field. The scale bars indicate $\lambda_{SPP}/2$.

Using FDTD simulation, we record the electric and magnetic field components of SPP wave generated from the square coupling structure described in the "simulation framework" section. FIG. 19 shows the snapshots of the recorded SPP electric fields within one optical cycle starting at $\tau=0$ fs, when the SPP wave packet reaches maximum amplitude value at the center of the square coupling structure. The colormap shows the out-of-plane component of pure SPP electric field ($E_z$) and black arrows represent direction of the pure in-plane SPP electric field ($E_\parallel$). These electric and magnetic field components of pure SPP waves, extracted from FDTD, are used to calculate the SAM related properties.

The patterns shown in the snapshots of w1 component of ITR-PEEM (element 1308) are obtained due to delay dependent interference of in-plane fields of incident probe pulse and SPP generated by pump pulse. To reproduce these interference patterns from FDTD we proceed as following. From FDTD we obtain, $$E_x(\tau) = E_X^{SPP}(t) + E_x^{Probe}(t+\tau) \text{ and } E_y(\tau) = E_y^{SPP}(t) + E_y^{Probe}(t+\tau),$$

where $\tau$ defines the fs time delay between SPP and incident CPL probe light pulse and t denotes instantaneous time of SPP propagation when SPP wave packet reaches maximum amplitude value at center of square slit structure. Further, by advancing $\tau$ and thereafter plotting $(E_x(\tau)^2 + E_y(\tau)^2)^2$ we obtain the snapshots of element 1310 which are equivalent to the snapshots of element 1308.

Figure 20:
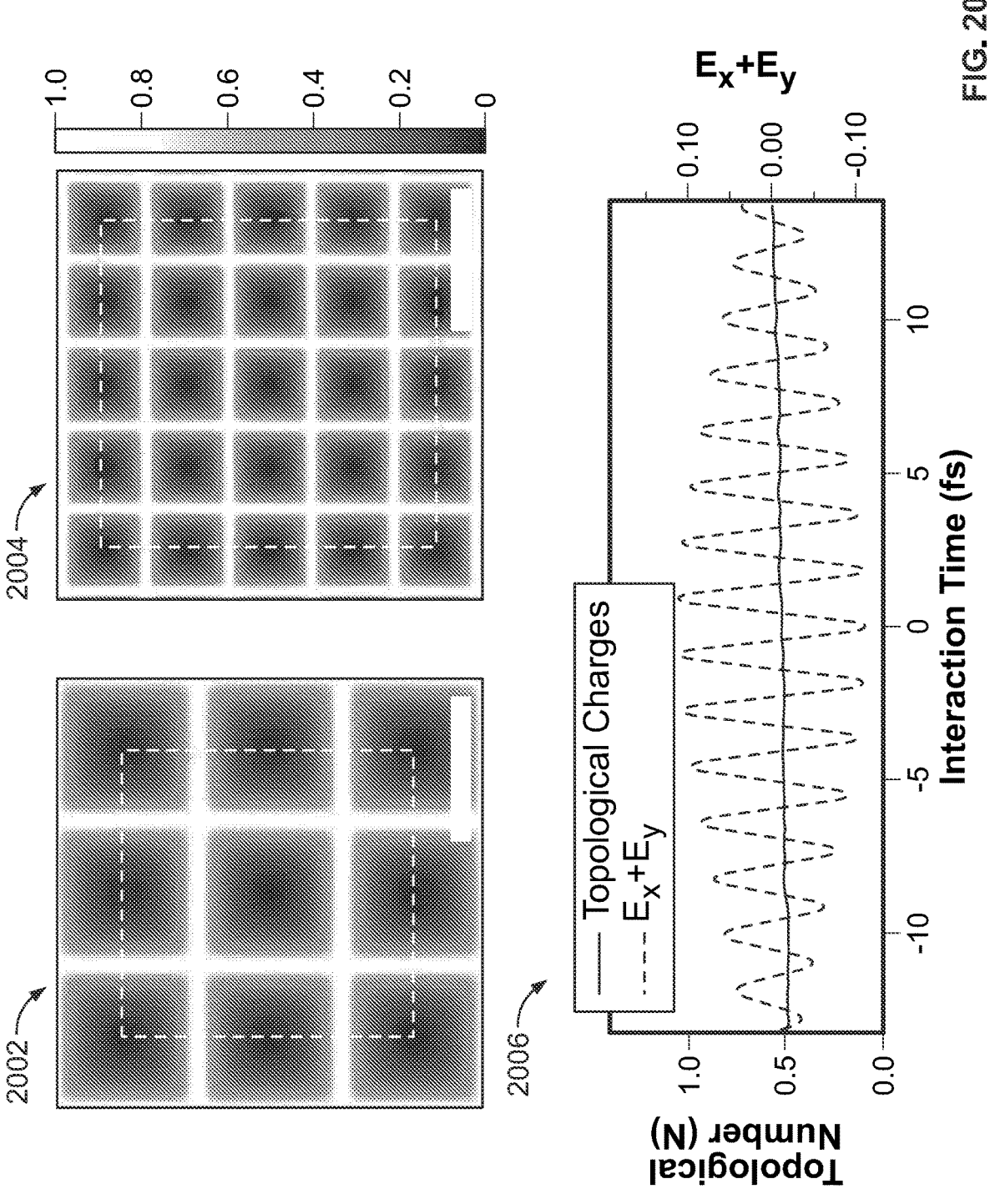
FIG. 20 shows characteristics for calculation of topological number (N).

FIG. 20 shows characteristics for calculation of topological number (N). Element 2002 shows the magnitude of the normalized in-plane SAM over 3×3 square domains at center. The white dotted regions include 4 effective square meron domains. The average N values plotted in element 1506 are calculated by integrating D within these 4 domains enclosed by the white dotted region. The scale bar is $\lambda_{SPP}/2$. Element 2004 shows the magnitude of the normalized in-plane SAM over 5×5 square domains at center. The white dotted regions include 16 effective square meron domains. To support the robustness of the lattice topology, the average N is further calculated by integrating D within these 16 domains at each time step. The scale bar is $\lambda_{SPP}$. The element 2006 shows a topological number for 16 meron domains within white dotted area of B ("Topological Charges" in FIG. 20) and the magnitude of the in-plane electric fields at the central domain center as a function of interaction time ("$E_x + E_y$" in FIG. 20).

The topological number (N) is given by $$N = \frac{1}{4\pi} \int \int D \, dx \, dy.$$

In our calculation, first, we define the boundary of the integration area by the square white dotted region of element 2002 of FIG. 20. The co-ordinates of the corners of the white dotted regions are chosen such that the magnitudes of the normalized in-plane SAM at time zero when SPP wave packet reaches maximum amplitude value at the square center, are minimum at those point. These corner co-ordinates define the lower and upper boundaries of the integration area in the x and y dimension. The effective number of square meron domains in the white dotted region is 4 (=1 from center domain+4×¼ from corner domains+4×½ from side domains). The average values of N over these 4 domains are calculated at time step and plotted in element 1508 as function of time. The plot reveals the stability of N value at 0.5 over ~20 fs duration. The analysis can be generalized to include larger number of domains, such as the 16 domains enclosed by the white dotted region in element 2004 of FIG. 20, which gives N as function of time in element 2006 in FIG. 20.

Terminology

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps or stages may be provided, or steps or stages may be eliminated, from the described processes. Accordingly, other implementations are within the scope of the following claims.

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

What is claimed is:
1. A method for performing lithography not limited by an optical system's diffraction limit, the method comprising the steps of:
    defining: (i) a polarization of an optical field of light, and
        (ii) a corresponding coupling-structure geometry;

providing a coupling structure having the defined coupling-structure geometry in a metallic material, the coupling structure defining a region of the metallic material; and
    directing light having the defined polarization to a center of the region, thereby forming a lattice of plasmonic merons having a finer contrast resolution than a diffraction or reflection based resolution determined by Abbe limit based on the defined polarization of the optical field.

2. The method of claim 1, wherein the finer contrast resolution is recorded by a polarization sensitive resist material in a near-field of a plasmonic field corresponding to the region.

3. The method of claim 1, wherein:
    defining the polarization comprises selecting between left circular polarization (LCP) and right circular polarization (RCP); and
    the metallic material comprises a chiral photoresist that responds differently to the LCP and the RCP.

4. The method of claim 1, wherein:
    surface plasmon polaritons (SPPs) form within the region in response to the light; and
    interaction of light with the coupling structure creates SPP field interference, wherein the SPP field interference forms the lattice of plasmonic merons.

5. The method of claim 4, wherein a dimension of the coupling structure is a multiple of wavelength $\lambda_{SPP}$ of the SPPs.

6. The method of claim 1, wherein the defined coupling-structure geometry of the coupling structure comprises a shape of the defined region, wherein the shape is square or hexagon.

7. The method of claim 1, wherein providing the coupling structure comprises providing a slit having the defined coupling-structure geometry within the metallic material.

8. The method of claim 1, wherein the light is directed normal to a surface of the metallic material, as pulses having a duration in a range of 5-50 fs.

9. The method of claim 1, wherein the light is continuous and directed normal to a surface of the metallic material for a duration of time.

10. The method of claim 1, wherein the defined polarization comprises left circular polarization (LCP) or right circular polarization (RCP).

11. The method of claim 1, wherein the defined polarization of the light and the defined coupling-structure geometry define polarization singularities that define boundaries of cells of the lattice of plasmonic merons.

12. The method of claim 1, wherein the metallic material comprises a surface plasmon supporting material, the method further comprising:
    lithographically forming a pattern in the metallic material according to the lattice.

13. A system for performing lithography not limited by an optical system's diffraction limit, the system comprising:
    a light source configured to generate an optical field of light having a polarization; and
    a coupling structure having a coupling-structure geometry in a metallic material, the coupling structure defining a region of the metallic material, wherein, when the light is directed to a center of the region, the coupling structure forms a lattice of plasmonic merons having a finer contrast resolution than a diffraction or reflection based resolution determined by Abbe limit based on the polarization of the optical field.

14. The system of claim 13, wherein the finer contrast resolution is recorded by a polarization sensitive resist material in a near-field of a plasmonic field corresponding to the region.

15. The system of claim 13, wherein the polarization comprises a left circular polarization (LCP) or a right circular polarization (RCP), and wherein the metallic material comprises a chiral photoresist that responds differently to the LCP and the RCP.

16. The system of claim 13, wherein:

surface plasmon polaritons (SPPs) form within the region in response to the light; and interaction of light with the coupling structure creates SPP field interference, wherein the SPP field interference forms the lattice of plasmonic merons.

17. The system of claim 16, wherein a dimension of the coupling structure is a multiple of wavelength $\lambda_{SPP}$ of the SPPs.

18. The system of claim 13, wherein the coupling-structure geometry of the coupling structure comprises a shape of the region, wherein the shape is square or hexagon.

19. The system of claim 13, wherein the coupling structure comprises a slit having the coupling-structure geometry within the metallic material.

20. The system of claim 13, wherein the light is directed normal to a surface of the metallic material, as pulses having a duration in a range of 5-50 fs.

21. The system of claim 13, wherein the light is continuous and directed normal to a surface of the metallic material for a duration of time.

22. The system of claim 13, wherein the polarization comprises left circular polarization (LCP) or right circular polarization (RCP).

23. The system of claim 13, wherein the polarization of the optical field of light and the coupling-structure geometry define polarization singularities that define boundaries of cells of the lattice of plasmonic merons.

24. The system of claim 13, wherein the metallic material comprises a surface plasmon supporting material, and wherein the light causes a pattern to be lithographically formed in the metallic material according to the lattice.

* * * * *